(12) United States Patent
Takaura et al.

(10) Patent No.: US 8,618,523 B2
(45) Date of Patent: Dec. 31, 2013

(54) SEMICONDUCTOR DEVICE

(75) Inventors: Norikatsu Takaura, Tokyo (JP); Yuichi Matsui, Kawasaki (JP); Motoyasu Terao, Hinode (JP); Yoshihisa Fujisaki, Hachioji (JP); Nozomu Matsuzaki, Kodaira (JP); Kenzo Kurotsuchi, Kodaira (JP); Takahiro Morikawa, Hachioji (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 380 days.

(21) Appl. No.: 12/302,740

(22) PCT Filed: May 31, 2006

(86) PCT No.: PCT/JP2006/310929
§ 371 (c)(1),
(2), (4) Date: Jun. 3, 2009

(87) PCT Pub. No.: WO2007/138703
PCT Pub. Date: Dec. 6, 2007

(65) Prior Publication Data
US 2010/0012917 A1      Jan. 21, 2010

(51) Int. Cl.
*H01L 47/00* (2006.01)

(52) U.S. Cl.
USPC ................ 257/4; 438/171; 257/E47.001

(58) Field of Classification Search
USPC ............... 257/4, 2, E47.001, 296–313, 533, 257/595–602, 923–924, E27.016–E27.017; 438/171, 190, 210, 238–253, 329, 379, 438/387, 444, 901
See application file for complete search history.

(56) References Cited

U.S. PATENT DOCUMENTS 5,883,827 A      3/1999   Morgan
2004/0233748 A1  11/2004  Terao et al.
(Continued)

FOREIGN PATENT DOCUMENTS

JP   2003-303941 A   10/2003
JP   2004-289029 A   10/2004
(Continued)

OTHER PUBLICATIONS

Stefan Lai et al., "OUM—A 180 nm Nonvalatile Memory Cell Element Technology For Stand Alone and Embedded Applications", IEEE International Electron Devices meeting, Technical Digest, USA, 2001, pp. 803-806.

(Continued)

*Primary Examiner* — Tony Tran
(74) *Attorney, Agent, or Firm* — Miles & Stockbridge P.C.

(57) ABSTRACT

On an insulating film (41) in which a plug (43) as a lower electrode is embedded, a laminated layer pattern of an insulating film (51) made of tantalum oxide, a recording layer (52) made of Ge—Sb—Te based chalcogenide to which indium is introduced and an upper electrode film (53) made of tungsten or tungsten alloy is formed, thereby forming a phase change memory. By interposing the insulating film (51) between the recording layer (52) and the plug (43), an effect of reducing programming current of a phase change memory and an effect of preventing peeling of the recording layer (52) can be achieved. Further, by using the Ge—Sb—Te based chalcogenide to which indium is introduced as the recording layer (52), the difference in work function between the insulating film (51) and the recording layer (52) is increased, and the programming voltage of the phase change memory can be reduced.

14 Claims, 22 Drawing Sheets

(56) References Cited

U.S. PATENT DOCUMENTS

| | | |
|---|---|---|
| 2005/0002227 A1* | 1/2005 | Hideki et al. .................. 365/163 |
| 2006/0001164 A1 | 1/2006 | Chang |
| 2006/0071244 A1 | 4/2006 | Gutsche et al. |
| 2006/0105556 A1 | 5/2006 | Matsui et al. |
| 2006/0148125 A1* | 7/2006 | Horii et al. ....................... 438/95 |
| 2006/0281216 A1* | 12/2006 | Chang et al. ................. 438/102 |
| 2008/0089154 A1 | 4/2008 | Terao et al. |
| 2009/0108247 A1* | 4/2009 | Takaura et al. ................... 257/2 |

FOREIGN PATENT DOCUMENTS

| | | |
|---|---|---|
| JP | 2004-349709 A | 12/2004 |
| JP | 2005-166976 A | 6/2005 |
| JP | 2005-229015 A | 8/2005 |
| JP | 2005-317812 A | 11/2005 |
| JP | 2006-140395 A | 6/2006 |
| WO | WO2005/076280 A1 | 8/2005 |
| WO | WO 2005/112118 A1 | 11/2005 |
| WO | WO 2007/057972 A1 | 5/2007 |
| WO | WO 2007/058175 A1 | 5/2007 |
| WO | WO 2007/099595 A1 | 9/2007 |

OTHER PUBLICATIONS

Office Action dated Mar. 27, 2012 in Japanese Patent Application No. 2008-517762.

Office Action dated Apr. 20, 2012 in European Application No. 06 756 849.3.

* cited by examiner

| STATE OF RECORDING LAYER 52 | AMORPHOUS PHASE | CRYSTALLINE PHASE |
|---|---|---|
| RESISTANCE OF RECORDING LAYER 52 | LARGE RESISTANCE | SMALL RESISTANCE |

SEMICONDUCTOR DEVICE

TECHNICAL FIELD

The present invention relates to a semiconductor device, and more particularly to a technique effectively applied to a semiconductor device including a phase change memory.

BACKGROUND ART

In a nonvolatile semiconductor storage device for storing data, there are various types of data storage format in a memory cell. Among them, a phase change memory is a nonvolatile memory using a phase change film.

The phase change memory is a nonvolatile memory in which memory information is written by changing a crystalline state of a storage element in accordance with Joule heat by the current flowing through the storage element itself. Since a recording layer is once melted by applying heat of higher than 600° C. by Joule heat when forming a noncrystalline (amorphous) state, the writing current tends to be large, and a resistance value changes by two to three orders of magnitude in accordance with the crystalline state. Since this memory uses a resistance value as a signal, a read signal is large and a sense operation is easy.

The phase change memory is described in, for example, U.S. Pat. No. 5,883,827 (Patent Document 1) and others.

According to the configuration of the phase change memory in FIG. 12 of the U.S. Pat. No. 5,883,827 (Patent Document 1), the phase change memory comprises a memory array, a row (row) decoder XDEC, a bit (column) decoder YDEC, a read circuit RC, and a write circuit WC. The memory array is formed by disposing memory cells MCpr at respective intersections of word lines WLp (p=1, . . . , n) and data lines DLr (r=1, . . . , m). Each of the memory cells is configured by inserting a storage element R and a select transistor QM connected in series between a bit line DL and a ground potential. The word line WL is connected to a gate of the select transistor and a bit select line YSr (r=1, . . . , m) is connected to a corresponding bit select switch QAr, respectively.

In the configuration as mentioned above, when the select transistor on the word line selected by the row decoder XDEC enters the conduction state and the bit select switch corresponding to the bit select line selected by the bit decoder YDEC enters the conduction state, a current path is formed in the select memory cell, and a read signal is generated to a common bit line I/O. Since the resistance value in the select memory cell differs depending on the memory information, the voltage output to the common bit line I/O differs depending on the memory information. By specifying the difference by the read circuit RC, the memory information of the select memory cell is read.

The phase change memory uses a chalcogenide material such as a Ge—Sb—Te based material containing at least antimony (Sb), germanium (Ge) and tellurium (Te) as a material of a recording layer (phase change layer). Also, the characteristics of the phase change memory using the chalcogenide material have been reported (for example, Non-Patent Document 1).

Patent Document 1: U.S. Pat. No. 5,883,827

Non-Patent Document 1: IEEE International Electron Devices meeting, TECHNICAL DIGEST, USA, 2001, pp. 803-806

DISCLOSURE OF THE INVENTION

Problem to be Solved by the Invention

According to the studies by the inventors of the present invention, the following facts have been revealed.

In a phase change memory, a recording layer made of chalcogenide and an upper electrode film are formed in this order from below on a lower electrode formed of a metal plug. However, when the recording layer made of chalcogenide is directly formed on the lower electrode, since the recording layer made of chalcogenide is in contact with the lower electrode having high heat conductivity, the Joule heat generated in the recording layer made of chalcogenide is transmitted to a lower electrode side and easily dissipated. Therefore, the phase change of the chalcogenide is difficult to occur, and the programming current of the phase change memory is increased. Further, when the recording layer made of chalcogenide is directly formed on an interlayer insulating film in which a metal plug to be a lower electrode is embedded, since the chalcogenide does not have sufficient adhesiveness to an interlayer insulating film such as a silicon oxide film, the recording layer made of chalcogenide is easily peeled off, which may cause the increase in the programming current or the programming voltage and the reduction in the number of rewrites of the phase change memory. Therefore, there is a possibility that performance and reliability of a semiconductor device including the phase change memory are reduced when the recording layer made of chalcogenide is directly formed on the lower electrode.

Consequently, the inventors of the present invention have studied the structure in which the recording layer made of chalcogenide is not directly formed on the lower electrode of the metal plug but a thin tantalum oxide film is interposed between the lower electrode and the recording layer made of chalcogenide. In this case, the phase change memory is configured by forming a thin tantalum oxide film on the interlayer insulating film in which a metal plug to be the lower electrode is embedded and then sequentially forming the recording layer made of chalcogenide and the upper electrode film on the tantalum oxide film. The heat conductivity of tantalum oxide is lower than that of the metal plug to form the lower electrode. Therefore, the heat conduction from the recording layer made of chalcogenide to the lower electrode side is blocked by the tantalum oxide film, and the Joule heat generated in the recording layer made of chalcogenide is difficult to be transmitted to the lower electrode side. Therefore, the phase change of chalcogenide easily occurs and the programming current of the phase change memory can be reduced. Further, since a tantalum oxide film has good adhesiveness to chalcogenide and also has good adhesiveness to an interlayer insulating film such as a silicon oxide film, the peeling of the recording layer made of chalcogenide can be prevented by interposing the tantalum oxide film.

According to the studies by the inventors of the present invention, however, although it is possible to obtain the effects of reducing the programming current of the phase change memory and preventing the peeling of the recording layer made of chalcogenide by interposing a tantalum oxide film, the programming characteristics of the phase change memory are affected when interposing a tantalum oxide film between the recording layer made of chalcogenide and the lower electrode.

More specifically, by interposing a tantalum oxide film between the lower electrode and the recording layer made of chalcogenide, the recording layer made of chalcogenide is adjacent and bonded to the tantalum oxide film instead of the lower electrode, and the difference in work function between the recording layer made of chalcogenide and its adjacent layer is reduced. As a result, the band bending of the chalcogenide layer at the bonding interface is reduced, and the programming voltage necessary for the band bending required for exciting the phase change is increased.

As described above, although it is possible to obtain the effects of reducing the programming current of the phase change memory resulting from the heat insulation effect of the tantalum oxide and preventing the peeling of the recording layer made of chalcogenide by the tantalum oxide film by interposing the tantalum oxide film between the lower electrode and the recording layer made of chalcogenide, the programming voltage of the phase change memory is increased due to the reduction in band bending of the recording layer made of chalcogenide caused by the bonding to the tantalum oxide layer. The increase in programming voltage degrades the performance of the semiconductor device including the phase change memory.

Therefore, for the improvement of the performance and reliability of a semiconductor device including a phase change memory, the reduction in the programming current of the phase change memory and the prevention of the peeling of the recording layer made of chalcogenide as well as the reduction in the programming voltage of the phase change memory are desired.

An object of the present invention is to provide a technique capable of improving the performance of a semiconductor device.

The above and other objects and novel characteristics of the present invention will be apparent from the description of this specification and the accompanying drawings.

Means for Solving the Problems

The typical ones of the inventions disclosed in this application will be briefly described as follows.

A semiconductor device according to the present invention comprises: a lower electrode; a first insulating film formed on the lower electrode; and a recording layer formed on the first insulating film and made of Ge—Sb—Te based chalcogenide to which indium is introduced.

Further, a semiconductor device according to the present invention comprises: a lower electrode; a first insulating film formed on the lower electrode; and a recording layer formed on the first insulating film and made of Ge—Sb—Te based chalcogenide to which oxygen is introduced.

Further, a semiconductor device according to the present invention comprises: a lower electrode; a first insulating film formed on the lower electrode; and a recording layer formed on the first insulating film and made of Ge—Sb—Te based chalcogenide whose defect density is increased.

Further, a semiconductor device according to the present invention comprises: a lower electrode; a first insulating film formed on the lower electrode; and a recording layer formed on the first insulating film and made of Ge—Sb—Te based chalcogenide, wherein Ge—Sb—Te based chalcogenide to which a process for increasing work function (that is, reducing Fermi level) is performed is used as the recording layer.

Further, a semiconductor device according to the present invention comprises: a lower electrode made of tantalum; a tantalum oxide film formed on the lower electrode; and a recording layer formed on the tantalum oxide film and made of chalcogenide.

Effect of the Invention

The effects obtained by typical ones of the inventions disclosed in this application will be briefly described below.

It is possible to improve the performance of a semiconductor device.

BEST MODE FOR CARRYING OUT THE INVENTION

Figure 1:
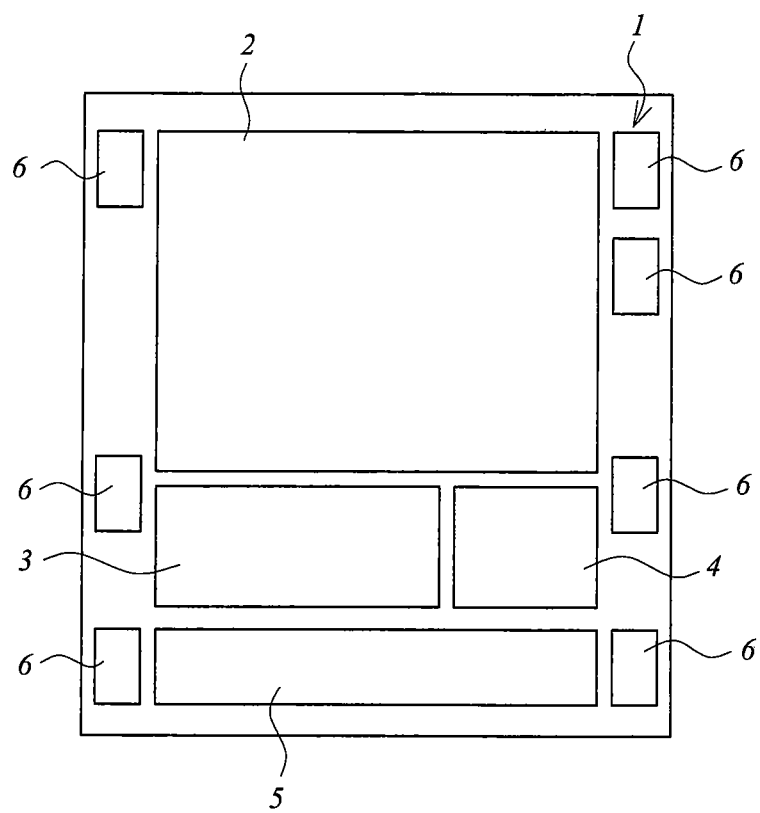
FIG. 1 is plan view showing the schematic configuration of the semiconductor device according to the first embodiment of the present invention.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle, and the number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it can be conceived that they are apparently excluded in principle. The same goes for the numerical value and the range described above.

Hereinafter, embodiments of the present invention will be described in detail with reference to the accompanying drawings. Note that components having the same function are denoted by the same reference numbers throughout the drawings for describing the embodiments, and the repetitive description thereof will be omitted. Further, the descriptions of the same or similar components are not repeated in principle except the case where the descriptions are particularly essential.

Also, in the drawings used in the embodiments, hatching is omitted in some cases even in a cross-sectional view and hatching is used in some cases even in a plan view so as to make the drawings easy to see.

First Embodiment

A semiconductor device and a manufacturing method thereof according to the present embodiment will be described with reference to the drawings.

FIG. 1 is a plan view (plan layout view, chip layout view) showing a schematic configuration of the semiconductor device (nonvolatile semiconductor storage device, semiconductor chip) according to the present embodiment.

The semiconductor device (semiconductor chip) 1 of the present embodiment is a semiconductor device (semiconductor storage device) including a phase change memory (phase change nonvolatile memory, PCM (Phase Change Memory), OUM (Ovonic Unified Memory)) which is a phase change nonvolatile memory (nonvolatile storage element).

As shown in FIG. 1, the semiconductor device 1 of the present embodiment has a phase change memory region 2 in which a memory cell array of a phase change memory is formed. Further, the semiconductor device 1 has a RAM region 3 in which a RAM (Random Access Memory) circuit such as a DRAM (Dynamic RAM) or an SRAM (Static RAM) is formed, a CPU region 4 in which a logic circuit such as a CPU or an MPU is formed, an analog circuit region 5 in which an analog circuit is formed, an I/O region 6 in which an input/output circuit is formed and others according to need.

In the phase change memory region 2, as a main circuit of the semiconductor device 1, a nonvolatile memory that stores relatively large capacity information is formed by a phase change memory which is a phase change nonvolatile memory. The phase change memory is a nonvolatile memory in which a phase of a recording layer (corresponding to recording layer 52 described later) of each memory cell is changed between an amorphous state and a crystalline state to change the resistivity (resistance value) thereof so that the current passing through each memory cell at the time of accessing is changed in accordance with the memory information. In the phase change memory, the phase state of the recording layer (phase change film) (whether the phase change film is in an amorphous state or in a crystalline state) corresponds to the memory information, and the memory information of the select memory cell can be read by the current passing through the select memory cell to be accessed.

Next, an example of the configuration of the memory array of the phase change memory region 2 will be described with reference to the circuit diagram in FIG. 2.

Figure 2:
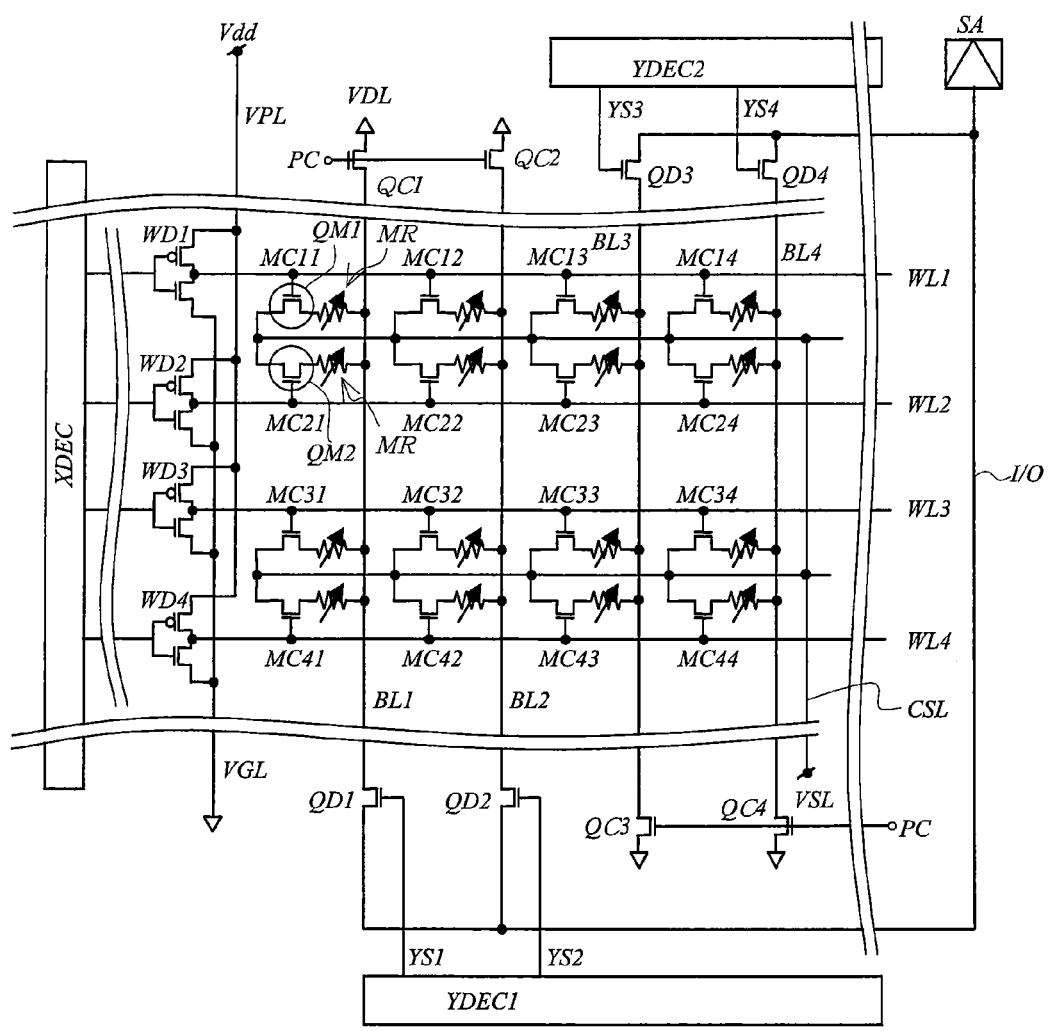
FIG. 2 is a circuit diagram showing an example of the configuration of a memory array of the phase change memory region of the semiconductor device according to the first embodiment of the present invention.

The configuration of the memory array shown in FIG. 2 is known as a NOR type and high-speed reading can be performed therein. Therefore, it is suitable for the storage of system program and is used as a single memory chip or for a logic LSI in a microcomputer. In FIG. 2, only a part of the array including four word lines WL1 to WL4 and four bit lines BL1 to BL4 is shown so as to prevent the drawing from being complicated. MC11 to MC14 denote four memory cells connected to WL1. Similarly, MC21 to MC24, MC31 to MC34 and MC41 to MC44 denote memory cells connected to WL2 to WL4, respectively. BL1 denotes a bit line to which the four memory cells MC11 to MC41 are connected. Similarly, the memory cells MC12 to MC42, MC13 to MC 43 and MC14 to MC44 are connected to bit lines BL2, BL3 and BL4, respectively.

Each of the memory cells includes one MISFET (corresponding to one of MISFETs QM1 and QM2 described later) and a storage element or memory material MR connected thereto in series (corresponding to recording layer 52 or resistor element 54 including recording layer 52 described later). Each of the word lines (WL1 to WL4) is connected to the gate electrode constituting each memory call. Each of the bit lines (BL1 to BL4) is connected to the memory material MR constituting each memory cell. Word drivers WD1 to WD4 drive the word lines WL1 to WL4, respectively. The signal from the row decoder (X address decoder) XDEC determines which word drivers WD1 to WD4 are to be selected.

VPL denotes a power supply line for each word driver, and power supply voltage is Vdd. VGL denotes a potential drawing line of each word driver and is fixed to the ground potential. QD1 denotes a select transistor for pre-charging the bit line BL1. Similarly, QD2 to QD4 are select transistors for pre-charging the bit lines BL2 to BL4, respectively. Each of the select transistors (QD1 to QD4) is selected in accordance with an address input through a bit decoder YDEC1 or a bit decoder YDEC2. In this example, the bit decoder YDEC1 and the bit decoder YDEC2 are alternately in charge of two consecutive selected bit lines. An output by the read is detected by a sense amplifier SA.

Figure 3:
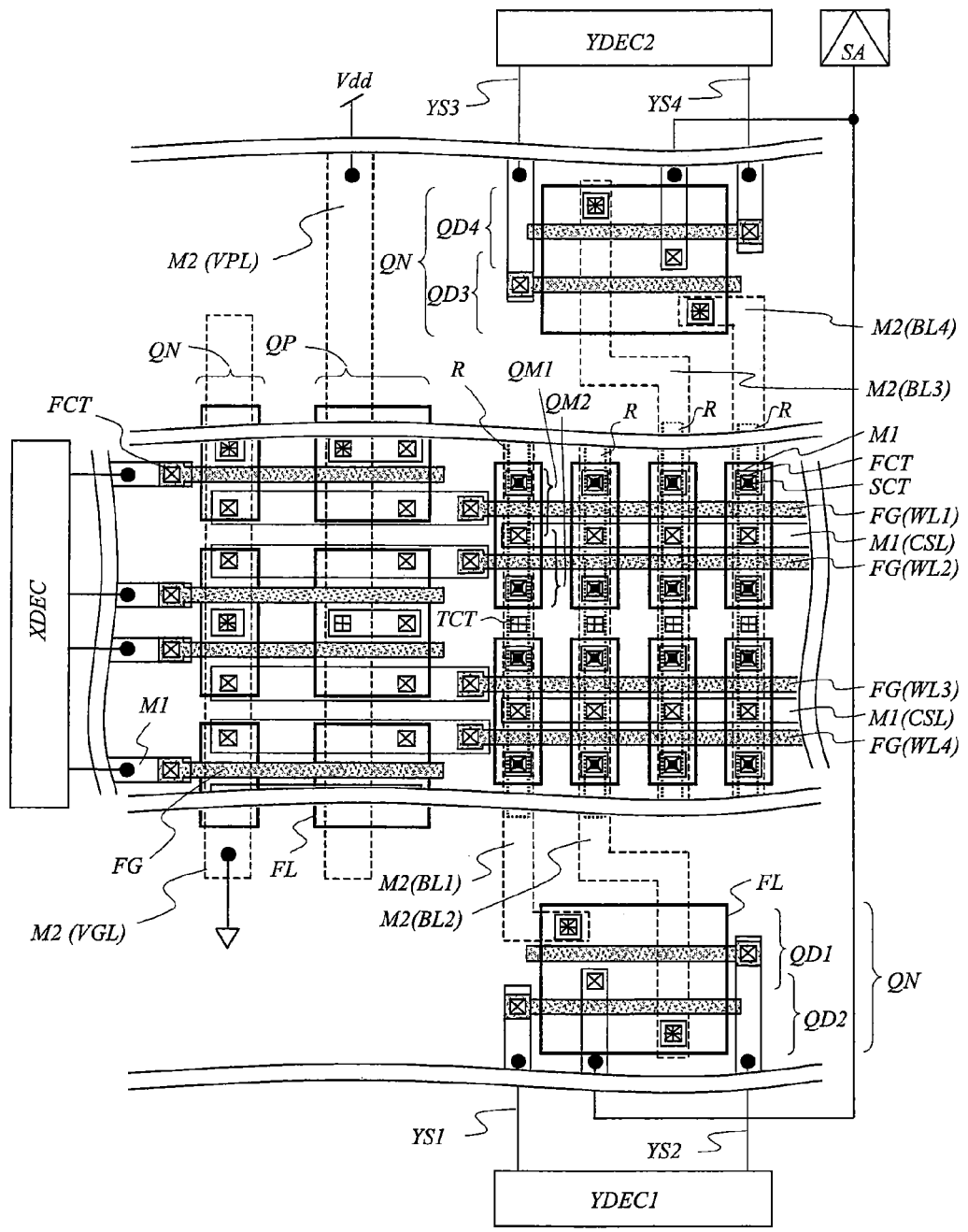
FIG. 3 is a plan view showing the plan layout corresponding to the array configuration in FIG. 2.

FIG. 3 shows a plan layout (plan view) corresponding to the array configuration of FIG. 2.

In FIG. 3, FL denotes an active region, M1 denotes a first metal layer (corresponding to wiring 37 described later), M2 denotes a second metal layer (corresponding to wiring 72 described later), a gate electrode pattern FG is a layer for use as a gate electrode of a transistor formed on a silicon substrate (corresponding to conductive film pattern for constituting gate electrodes 16a, 16b and 16c described later), FCT denotes a contact hole (corresponding to contact hole 32 described later) connecting the upper surface of FL and the lower surface of M1, R (corresponding to resistor element 54 described later) denotes a laminated film of a storage element (corresponding to recording layer 52 described later) and its upper electrode layer (corresponding to upper electrode film 53 described later), SCT denotes a contact hole (corresponding to through hole 42 described later) connecting the upper surface of M1 and the lower surface of R, and TCT denotes a contact hole (corresponding to through hole 65 described later) connecting the upper surface of M1 and the lower surface of M2.

R is extended to M2 through TCT between the memory cells connected to the same bit line. This M2 is used as a bit line for each of them. The word lines WL1 to WL4 are formed of FG. A laminated layer of polysilicon and silicide (alloy of silicon and high-melting-point metal) is used for FG. One MISFET constituting the memory cell MC11 is QM1. The MISFET QM2 constituting MC21 shares a source region with QM1. As shown in FIG. 3, the same goes for MISFETs constituting other cells. The bit lines BL1 to BL4 are connected to the source side of the transistors (MISFETs) QD1 to QD4, respectively, disposed in the outer periphery of the memory array. Drain regions of QD1 and QD2 and drain regions of QD3 and QD4 are common to one another. These transistors have a function to pre-charge each bit line. At the same time, they also have a function to select a specified bit line upon reception of a signal from YDEC1 or YDEC2. In FIG. 3, the transistors are n-channel type. Circuit elements constituting each block are not particularly limited and are typically formed on one semiconductor substrate made of, for example, single crystal silicon through a semiconductor integrated circuit technique for a CMISFET (Complementary MISFET: complementary MIS transistor) or others. Furthermore, a chalcogenide material exhibiting the phase change is hybridized in an integrated circuit fabrication technique. For the patterning of these patterns, well-known photolithography and dry etching can be used. Manufacturing processes thereof will be described in more detail below.

Next, the structure of the semiconductor device according to the present embodiment will be described in more detail.

Figure 4:
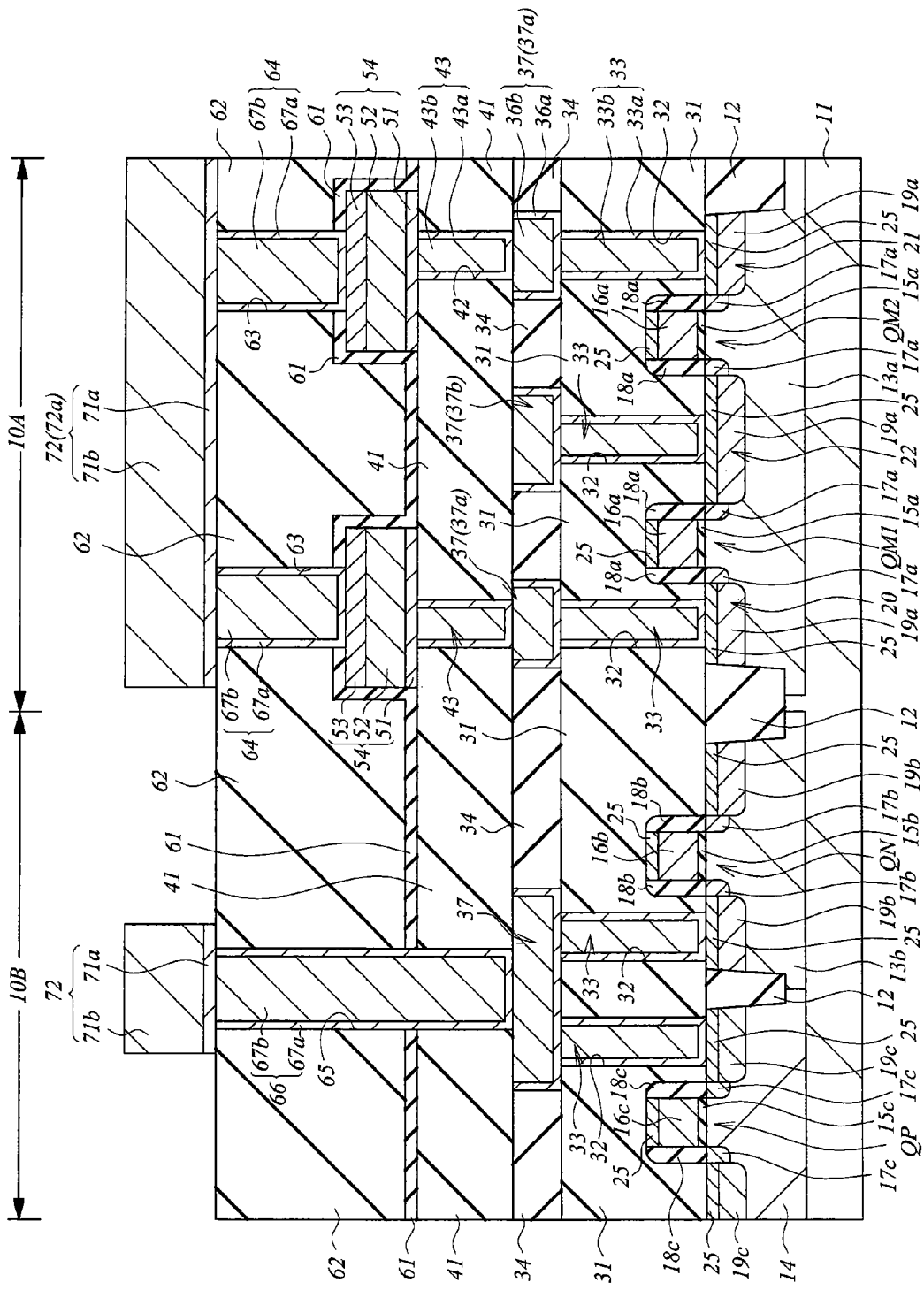
FIG. 4 is a cross-sectional view showing the principal part of the semiconductor device according to the first embodiment of the present invention.

FIG. 4 is a cross-sectional view showing the principal part of the semiconductor device 1 according to the present embodiment. In FIG. 4, a cross-section (cross-section of the principal part) of a phase change memory region 10A and a cross-section (cross-section of the principal part) of a peripheral circuit region (logic circuit region) 10B are shown. The phase change memory region 10A corresponds to a part of the phase change memory region 2 of the semiconductor device 1. The peripheral circuit region 10B corresponds to a part of the peripheral circuit region of the semiconductor device 1 (region in which an n-channel MISFET and a p-channel MISFET are formed), in which an X decoder circuit, a Y decoder circuit, a sense amplifier circuit, an input/output circuit (input/output circuit of the I/O region 6), a logic circuit (logic circuit of the CPU region 4), and others are formed from the MISFETs constituting peripheral circuits (MISFETs formed in the peripheral circuit region 10B) and others. Note that the cross-section of the phase change memory region 10A and the peripheral circuit region 10B are shown as being adjacent to each other in FIG. 4 for the sake of easy understanding, but the positional relation between the cross-section of the phase change memory region 10A and the peripheral circuit region 10B can be changed as required.

As shown in FIG. 4, isolation regions 12 are formed on the main surface of a semiconductor substrate (semiconductor wafer) 11 made of p-type single-crystal silicon, and p-wells 13a and 13b and an n-well 14 are formed in the active regions isolated by these isolation regions 12. Of these, the p-well 13a is formed in the phase change memory region 10A, the p-well 13b and the n-well 14 are formed in the peripheral circuit region 10B.

The n-channel MISFETs (Metal Insulator Semiconductor Field Effect Transistors) QM1 and QM2 are formed on the p-well 13a of the phase change memory region 10A. The n-channel MISFET (Metal Insulator Semiconductor Field Effect Transistor) QN is formed on the p-well 13b of the peripheral circuit region 10B, and the p-channel MISFET (Metal Insulator Semiconductor Field Effect Transistor) QP is formed on the n-well 14 of the peripheral circuit region 10B.

The MISFETs QM1 and QM2 of the phase change memory region 10A are MISFETs for selecting a memory cell of the phase change memory region 10A (2). The MISFETs QM1 and QM2 are formed on the p-well 13a so as to be separated from each other, and each of them has a gate insulating film 15a on the surface of the p-well 13a and a gate electrode 16a on the gate insulating film 15a. Sidewalls (sidewall spacers) 18a formed of a silicon oxide film, a silicon nitride film, or a laminated film thereof are formed on the sidewalls of the gate electrode 16a. A semiconductor region (n-type impurity diffusion layer) 20 as a drain region of the MISFET QM1, a semiconductor region (n-type impurity diffusion layer) 21 as a drain region of the MISFET QM2, and a semiconductor region (n-type impurity diffusion layer) 22 as a source region of the MISFETs QM1 and QM2 are formed in the p-well 13a. Each of the semiconductor regions 20, 21, and 22 has an LDD (Lightly Doped Drain) structure and is formed of an n$^-$-type semiconductor region 17a and an n$^+$-type semiconductor region 19a with an impurity concentration higher than that of the n$^-$-type semiconductor region 17a. The n$^-$-type semiconductor region 17a is formed in the p-well 13a below the sidewall 18a, the n$^+$-type semiconductor region 19a is formed in the p-well 13a outside the gate electrode 16a and the sidewall 18a, and the n$^+$-type semiconductor region 19a is formed in the p-well 13a at a position spaced apart from the channel region by the size of the n$^-$-type semiconductor region 17a. The semiconductor region 22 serves as a common source region shared by the adjacent MISFETs QM1 and QM2 formed in the same element active region. Note that, although the case in which the source region is shared by the MISFETs QM1 and QM2 is described in the present embodiment, the drain region may be shared by these MISFETs in another embodiment. In this case, the semiconductor region 22 serves as a drain region, and the semiconductor regions 20 and 21 serve as source regions.

A MISFET QN formed in the peripheral circuit region 10B has a structure similar to those of the MISFETs QM1 and QM2. More specifically, the MISFET QN has a gate insulating film 15b on the surface of the p-well 13b and a gate electrode 16b on the gate insulating film 15b, and sidewalls (sidewall spacers) 18b made of silicon oxide or the like are formed on the sidewalls of the gate electrode 16b. An n$^-$-type semiconductor region 17b is formed in the p-well 13b below the sidewall 18b and an n$^+$-type semiconductor region 19b with an impurity concentration higher than that of the n$^-$-type semiconductor region 17b is formed outside the n$^-$-type semiconductor region 17b. The n$^-$-type semiconductor region 17b and the n$^+$-type semiconductor region 19b form the source and drain regions having an LDD structure of the MISFET QN.

A MISFET QP formed in the peripheral circuit region 10B has a gate insulating film 15c on the surface of an n-well 14 and a gate electrode 16c on the gate insulating film 15c, and sidewalls (sidewall spacers) 18c made of silicon oxide or the like are formed on the sidewalls of the gate electrode 16c. A p$^-$-type semiconductor region 17c is formed in the n-well 14 below the sidewall 18c, and a p$^+$-type semiconductor region 19c with an impurity concentration higher than that of the p$^-$-type semiconductor region 17c is formed outside the p$^-$-type semiconductor region 17c. The p$^-$-type semiconductor region 17c and the p$^+$-type semiconductor region 19c form the source and drain regions having an LDD structure of the MISFET QP.

A metal silicide layer (for example, a cobalt silicide (CoSi$_2$) layer) 25 is formed on each surface of the gate electrodes 16a, 16b and 16c, the n$^+$-type semiconductor regions 19a and 19b and the p$^+$-type semiconductor region 19c. By this means, the diffusion resistance and the contact resistance of the n$^+$-type semiconductor regions 19a and 19b and the p$^+$-type semiconductor region 19c can be reduced.

On the semiconductor substrate 11, an insulating film (interlayer insulating film) 31 is formed so as to cover the gate electrodes 16a, 16b, and 16c. The insulating film 31 is formed of, for example, a silicon oxide film, and an upper surface of the insulating film 31 is planarized so as to have approximately the same height in the phase change memory region 10A and the peripheral circuit region 10B.

Contact holes (openings or connection holes) 32 are formed in the insulating film 31, and a plug (contact electrode) 33 is formed in each of the contact holes 32. The plug 33 is formed of a conductive barrier film 33a formed on the bottom and sidewall of the contact hole 32 and made of a titanium film, a titanium nitride film or a laminated film thereof and a tungsten (W) film (main conductive film) 33b formed on the conductive barrier film 33a so as to fill the contact hole 32. The contact hole 32 and the plug 33 are formed on the n$^+$-type semiconductor regions 19a and 19b, the p$^+$-type semiconductor region 19c, and the gate electrodes 16a, 16b, and 16c.

An insulating film 34 formed of, for example, a silicon oxide film is formed on the insulating film 31 in which the plugs 33 are embedded, and wirings (first wiring layers) 37 as first-layer wirings are formed in wiring trenches formed in the insulating film 34. Each wiring 37 is formed of a conductive barrier film 36a formed on the bottom and sidewall of the wiring trench and made of a titanium film, a titanium nitride film or a laminated film thereof and a main conductive film 36b formed on the conductive barrier film 36a so as to fill the wiring trench and made of a tungsten film or the like. The wirings 37 are electrically connected via the plugs 33 to the n$^+$-type semiconductor regions 19a and 19b, the p$^+$-type semiconductor region 19c, and the gate electrodes 16a, 16b, and 16c. In the phase change memory region 10A, the wiring 37 connected via the plug 33 to the semiconductor region 22 for source of the MISFETs QM1 and QM2 (n$^+$-type semiconductor region 19a) forms a source wiring 37b.

An insulating film (interlayer insulating film) 41 formed of, for example, a silicon oxide film is formed on the insulating film 34 in which the wirings 37 are embedded. In the phase change memory region 10A, through holes (openings or connection holes) 42 are formed in the insulating film 41, and a plug (contact electrode or lower electrode) 43 is formed in each of the through holes 42. The plug 43 is formed of a conductive barrier film 43a formed on the bottom and sidewall of the through hole 42 and made of a titanium film, a titanium nitride film or a laminated film thereof and a tungsten (W) film (main conductive film) 43b formed on the conductive barrier film 43a so as to fill the through hole 42. Therefore, the plug 43 is a conductive portion formed (embedded) in the opening (through hole 42) of the insulating film 41, which is an interlayer insulating film. The through hole 42 and the plug 43 are formed on a wiring 37a, which is one of the wirings 37 and is connected via the plug 33 to the semiconductor regions 20 and 21 for drain of the MISFETs QM1 and QM2 in the phase change memory region 10A (n$^+$-type semiconductor regions 19a), and are electrically connected to the wiring 37a.

In the phase change memory region 10A, a resistor element 54 formed of a thin insulating film 51, a recording layer (storage layer, recording material film, phase change film, or phase change recording material film) 52 on the insulating film 51 and an upper electrode film (upper electrode or metal film) 53 on the recording layer 52 is formed on the insulating film 41 in which the plugs 43 are embedded. More specifically, the resistor element 54 is formed of a laminated pattern of the insulating film 51, the recording layer 52, and the upper electrode film 53.

The insulating film 51 is interposed between the insulating film 41 having the plugs 43 embedded therein and the recording layer 52 and has a function to improve the adhesion (adhesiveness) therebetween and to prevent the recording layer 52 from being peeled off. More specifically, the insulating film 51 can function as a peel-preventive film or a phase-change-material-peel-preventive film. Also, the insulating film 51 can function to prevent the heat of the recording layer 52 from escaping (transmitting) to the plug 43 side, whereby the thermal efficiency of the phase change memory is improved and the low-current rewriting of the phase change memory can be achieved. Further, the insulating film 51 can function as a heat-generating resistive layer for heating the recording layer 52. The insulating film 51 is preferably made of metal oxide (oxide of transition metal) and is more preferably made of tantalum oxide (for example, $Ta_2O_5$ or material with close composition to $Ta_2O_5$), whereby the above-described functions of the insulating film 51 can be accurately exerted. Further, the thickness of the insulating film 51 is, for example, 0.5 to 5 nm.

The recording layer 52 is a phase change film made of a phase change material (phase change substance), and is a material film (semiconductor film) capable of making a transition (phase change) between two states, that is, a crystalline state and an amorphous state. The recording layer 52 can make a transition (phase change) between a crystalline state and an amorphous state (non-crystalline state), and this recording layer 52 can function as a storage element. In other words, the recording layer 52 is an information recording layer of a phase change memory.

The recording layer 52 is made of, for example, a material (semiconductor) containing chalcogen elements (S, Se, Te), that is, a chalcogenide (chalcogenide semiconductor or chalcogenide material), and a Ge—Sb—Te based chalcogenide material containing at least germanium (Ge), antimony (Sb) and tellurium (Te) is used as a material of the recording layer 52 in the present embodiment. Further, indium (In) is introduced into the recording layer 52 in the present embodiment. More specifically, a Ge—Sb—Te based chalcogenide material introduced with indium (In) is used as the material of the recording layer 52. Therefore, the recording layer 52 contains germanium (Ge), antimony (Sb), tellurium (Te) and indium (In) as constituent elements thereof. The thickness of the recording layer 52 is, for example, about 10 to 200 nm. Chalcogenide mentioned here is a material containing at least one element of sulfur (S), selenium (Se), and tellurium (Te).

Figures 5, 6:
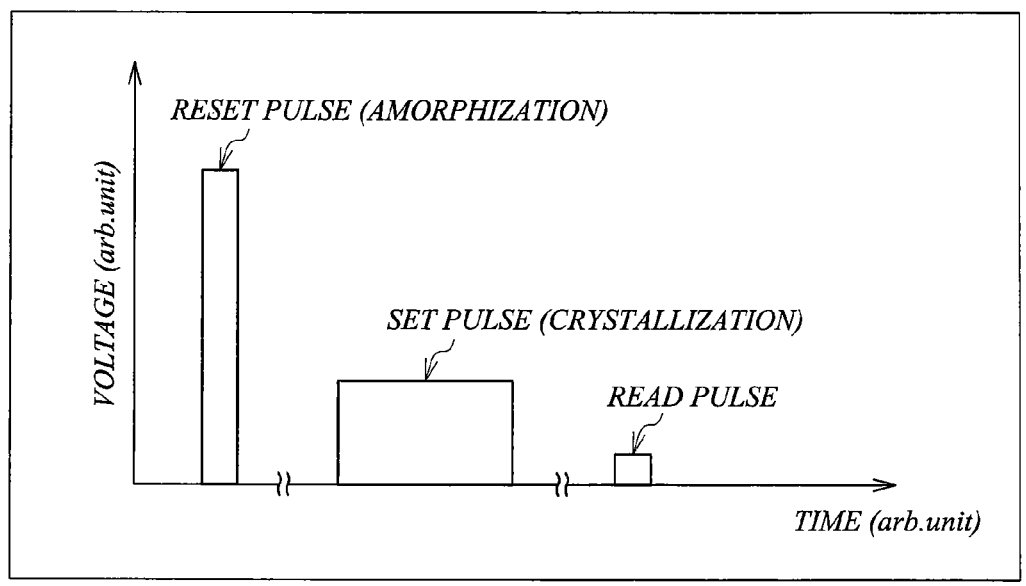
FIG. 5 is an explanatory diagram showing the correlation between the state of the phase change film and the resistance of the phase change film in the phase change memory.
FIG. 6 is a graph for describing the operation of the phase change memory.

FIG. 5 is an explanatory diagram (table) showing a correlation between the state (phase state) of the recording layer 52 and the resistance (resistivity) of the recording layer 52. As shown in FIG. 5, the recording layer 52 has different resistivities between an amorphous state and a crystalline state, and the resistance is high (high resistivity) in an amorphous state and the resistance is low (low resistivity) in a crystalline state. For example, the resistivity of the recording layer 52 in an amorphous state is 10 to 10000 times higher than the resistivity of the recording layer 52 in a crystalline state. Therefore, the recording layer 52 can make a transition (phase change) between two states, that is, a crystalline state and an amorphous state and can function as a resistor element whose resistance value is changed by the transition between the two states. As will be described later, the recording layer 52 can make a transition (phase change) between two states, that is, a crystalline state and an amorphous state through a heat treatment (heat treatment with Joule heat). Therefore, the recording layer 52 is made of a phase change material whose resistance value is changed through a heat treatment and can function as a resistor element whose resistance value is changed through a heat treatment. Also, as will be described later, the recording layer 52 is an information recording layer (storage layer, or storage element) of the phase change memory.

The upper electrode film 53 is formed of a conductive film such as a metal film and can be formed of, for example, a tungsten (W) film or a tungsten alloy film. The film thickness thereof can be, for example, about 10 to 200 nm. The upper electrode film 53 can function to reduce a contact resistance between a plug 64 described later and the resistor element 54 and to prevent the recording layer 52 from sublimating when a conductive barrier film 67a is formed after forming a through hole 63.

In the present embodiment, the upper electrode film 53 is formed by use of tungsten (W). Alternatively, a metal material capable of reducing the stress of the upper electrode film 53 can be used for the material of the upper electrode film 53 in place of tungsten (W). For example, molybdenum (Mo) with a small crystal grain diameter, Mo—W (molybdenum-tungsten) alloy or Ti—W (titanium-tungsten) alloy can be used for the upper electrode film 53. The above-mentioned metal with low stress has a function to suppress the peeling of the memory cell element (resistor element 54). As a result, uniformity of electrical characteristics of the memory cell element (resistor element 54), reliability of the number of rewrites, and resistance to high-temperature operation can be further improved.

The plug 43 functions as a lower electrode of the phase change memory, and a lower portion of the resistor element 54 (lower surface of the insulating film 51) is in contact with and electrically connected to the plug 43. Therefore, the lower portion of the resistor element 54 (lower surface of the insulating film 51) is electrically connected via the plug 43, the wiring 37a and the plug 33 to the drain regions 20 and 21 ($n^+$-type semiconductor regions 19a) of the MISFETs QM1 and QM2 in the phase change memory region 10A.

As shown in FIG. 4, an insulating film 61 and an insulating film (interlayer insulating film) 62 on the insulating film 61 are formed on the insulating film 41 so as to cover the resistor element 54. More specifically, the insulating film 61 is formed on the insulating film 41 including the upper surface of the upper electrode film 53 and the sidewall of the resistor element 54 (recording layer 52), and the insulating film 62 is formed on the insulating film 61 as an interlayer insulating film. The thickness of the insulating film 61 is smaller than that of the insulating film 62 (for example, several hundred nm) and can be, for example, about 5 to 20 nm. The insulating film 61 is formed of, for example, a silicon nitride film, and the insulating film 62 is formed of, for example, a silicon oxide film.

Although the details thereof will be described later, the insulating film 61 is formed of a material film allowing an etching speed (etching selectivity) to be different from that of the insulating film 62, and more preferably, the insulating film 61 and the insulating film 62 are made of different materials. Further, the insulating film 61 preferably has a thickness smaller than that of the upper electrode film 53 of the resistor element 54. The upper surface of the insulating film 62 is planarized so as to have approximately the same height in the phase change memory region 10A and the peripheral circuit region 10B.

In the phase change memory region 10A, through holes (openings or connection holes) 63 are formed in the insulating films 61 and 62, and at least a part of the upper electrode film 53 of the resistor element 54 is exposed at the bottom of each through hole 63. A plug (contact electrode) 64 is formed in the through hole 63. The plug 64 is formed of a conductive barrier film 67a formed on the bottom and sidewall of the through hole 63 and made of a titanium film, a titanium nitride film, or a laminated film thereof and a tungsten (W) film (main conductive film) 67b formed on the conductive barrier film 67a so as to fill the through hole 63. An aluminum film or the like can be used in place of the tungsten film 67b. The through hole 63 and the plug 64 are formed on the resistor element 54, and the plug 64 is electrically connected to the upper electrode film 53 of the resistor element 54. Therefore, the plug 64 is a conductive portion formed (embedded) in the opening (through hole 63) of the insulating film 62, which is an interlayer insulating film, and electrically connected to the upper electrode film 53.

Note that, as will be described later, the insulating film 61 is a film that functions as an etching stopper film when the through hole 63 is formed, that is, a film that functions as an etching stopper when dry etching is performed to the insulating film 62 to form the through holes 63, and is a film that functions to prevent the resistor element 54 (in particular, the upper electrode film 53) from being etched when the through hole 63 is formed.

Also, as will be described later, in a stage before the formation of the through holes 63, the state is such that the insulating film 61 is formed on the entire upper surface of the upper electrode film 53. At the time of the formation of the through holes 63, however, the insulating film 61 on the upper electrode film 53 is removed at the bottom of the through holes 63. Therefore, in the manufactured semiconductor device, the insulating film 61 is formed below the insulating film 62 and on the upper surface of the upper electrode film 53 other than the portion exposed from the through holes 63.

In the peripheral circuit region 10B, a through hole (opening or connection hole) 65 is formed in the insulating films 41, 61, and 62, and the upper surface of the wiring 37 is exposed at the bottom of the through hole 65. A plug (contact electrode) 66 is formed in the through hole 65. The plug 66 is formed of the conductive barrier film 67a formed on the bottom and sidewall of the through hole 65 and made of a titanium film, a titanium nitride film or a laminated film thereof and the tungsten (W) film (main conductive film) 67b formed on the conductive barrier film 67a so as to fill the through hole 65. The through hole 65 and the plug 66 are electrically connected to the wiring 37.

A wiring (second wiring layer) 72 as a second layer wiring is formed on the insulating film 62 in which the plugs 64 and 66 are embedded. For example, the wiring 72 is formed of a conductive barrier film 71a formed of a titanium film, a titanium nitride film or a laminated film thereof and an aluminum (Al) film or an aluminum alloy film (main conductive film) 71b on the conductive barrier film 71a. Alternatively, a conductive barrier film similar to the conductive barrier film 71a can be further formed on the aluminum alloy film 71b to form the wiring 72.

In the phase change memory region 10A, a wiring (bit line) 72a of the wiring 72 is electrically connected via the plug 64 to the upper electrode film 53 of the resistor element 54. Therefore, the wiring 72a that forms a bit line of the phase change memory region 10A is electrically connected via the plug 64, the resistor element 54, the plug 43, the wiring 37a, and the plug 33 to the drain regions 20 and 21 (n$^+$-type semiconductor region 19a) of the MISFETs QM1 and QM2 in the phase change memory region 10A.

In the peripheral circuit region 10B, the wiring 72 is electrically connected via the plug 66 to the wiring 37 and is further electrically connected via the plug 33 to the n$^+$-type semiconductor region 19b of the MISFET QN and the p$^+$-type semiconductor region 19c of the MISFET QP.

An insulating film (not shown) as an interlayer insulating film is formed on the insulating film 62 so as to cover the wiring 72, and further upper wiring layers (third and subsequent layer wirings) and others are formed. However, the illustration and description thereof will be omitted here.

In this manner, the semiconductor integrated circuit including the phase change memory (phase change non-volatile memory) in the phase change memory region 10A and the MISFETs in the peripheral circuit region 10B is formed on the semiconductor substrate 11, thereby configuring the semiconductor device according to the present embodiment.

As described above, the recording layer 52 (or the resistor element 54 including the recording layer 52) and the MISFETs QM1 and QM2 as memory cell transistors (transistors for memory cell selection) connected to the recording layer 52 (resistor elements 54) form the memory cells of the phase change memory. The gate electrodes 16a of the MISFETs QM1 and QM2 are electrically connected to the word lines (corresponding to the above-described word lines WL1 to WL4). The upper surface side of the resistor element 54 (upper electrode film 53) is electrically connected via the plug 64 to the bit lines (corresponding to the above-described bit lines BL1 to BL4) formed of the above-described wiring 72a. The lower surface side of the resistor element 54 (the lower surface side of the recording layer 52, that is, the insulating film 51) is electrically connected via the plug 43, the wiring 37a, and the plug 33 to the semiconductor regions 20 and 21 for drain of the MISFETs QM1 and QM2. The semiconductor region 22 for source of the MISFETs QM1 and QM2 is electrically connected via the plug 33 to the source wiring 37b (source line).

Note that, in the present embodiment, the case where the n-channel MISFETs QM1 and QM2 are used as memory cell transistors of a phase change memory (transistors for memory cell selection) is described. As another embodiment, other field-effect transistors such as p-channel MISFETs can be used in place of the n-channel MISFETs QM1 and QM2. However, as memory cell transistors of phase change memory, MISFETs are preferably used in view of high integration, and n-channel MISFETs QM1 and QM2 are more suitable compared with p-channel MISFETs because n-channel MISFETs have a lower channel resistance in an ON state.

Also, in the present embodiment, the resistor element 54 is electrically connected to the drains (semiconductor regions 10 and 11) of the MISFETs QM1 and QM2 in the memory region 10A via the plug 43, the wiring 37 (37a) and the plug 33. Alternatively, as another embodiment, the resistor element 54 can be electrically connected to the sources of the MISFETs QM1 and QM2 in the memory region 10A via the plug 43, the wiring 37 (37a) and the plug 33. In other words, the resistor element 54 may be electrically connected to one of the sources or the drains of the MISFETs QM1 and QM2 in the memory region 10A via the plug 43, the wiring 37 (37a) and the plug 33. However, it is more preferable that the drains instead of the sources of the MISFETs QM1 and QM2 in the memory region 10A are electrically connected to the resistor element 54 via the plug 33, the wiring 37 (37a) and the plug 43 in consideration of the function as the nonvolatile memory.

Next, the operation of the phase change memory (phase change memory formed in the phase change memory regions 2 and 10A) will be described.

Figure 7:
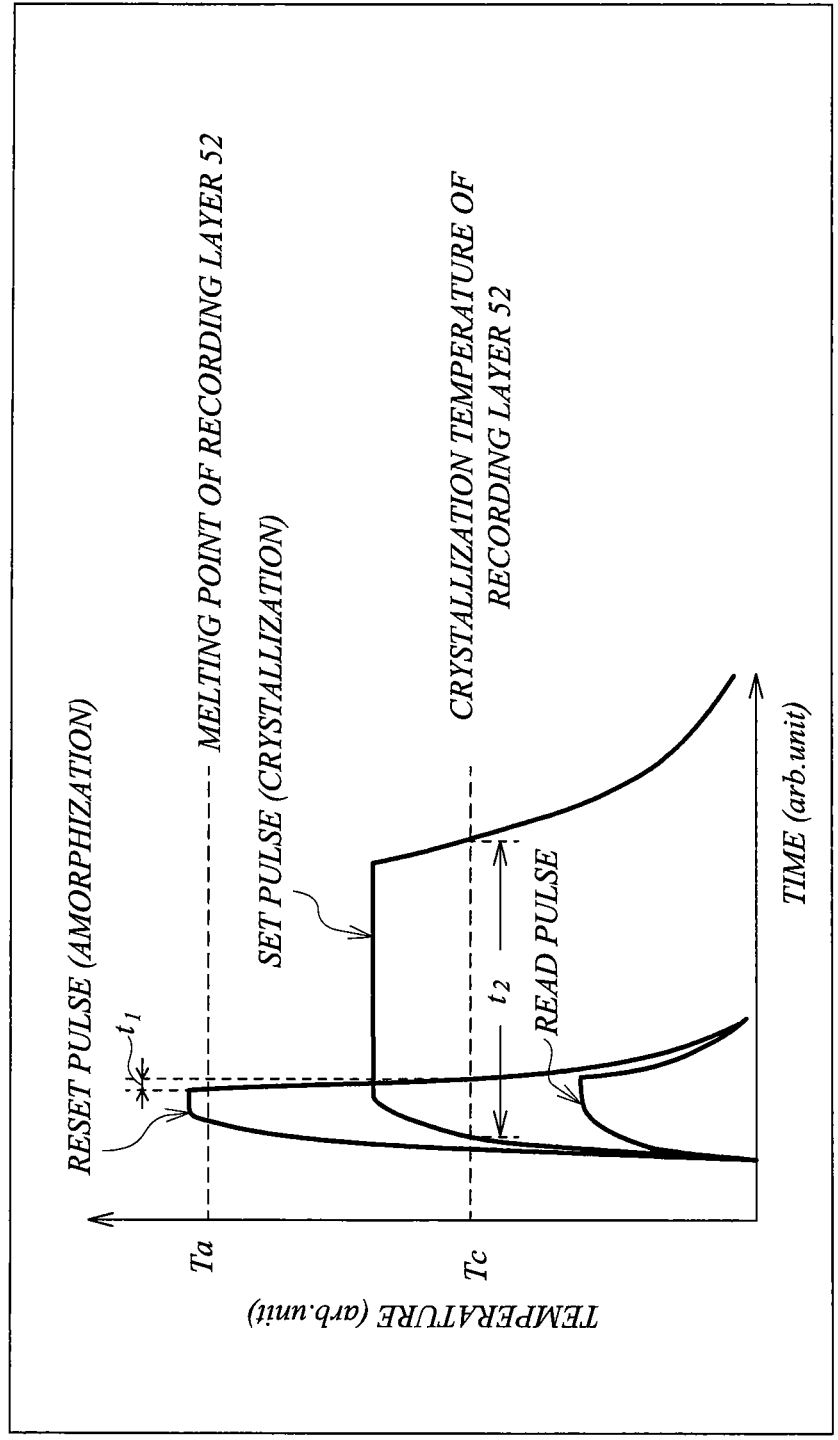
FIG. 7 is a graph for describing the operation of the phase change memory.

FIGS. 6 and 7 are graphs for describing the operation of the phase change memory. The vertical axis of the graph shown in FIG. 6 corresponds to voltages (in arbitrary unit) of a reset pulse, a set pulse and a read pulse to be applied to the phase change memory, and the horizontal axis thereof corresponds to time (in arbitrary unit). The vertical axis of the graph shown in FIG. 7 corresponds to temperatures (in arbitrary unit) of the recording layer 52 when the reset pulse, the set pulse and the read pulse are applied to the phase change memory, and the horizontal axis thereof corresponds to time (in arbitrary unit).

When memory information "0" is written in a storage element (memory cell of the phase change memory), that is, at the time of a reset operation of the phase change memory (amorphization of the recording layer 52), a reset pulse as shown in FIG. 6 is applied via the bit line (wiring 72a) and the plug 64 to the resistor element 54 (recording layer 52). A fixed potential (for example, 0 V) is applied via the source wiring 37b and the plug 33 to the source (semiconductor region 22) of the MISFETs QM1 and QM2, and a predetermined voltage is applied via the word line to the gate electrode 16a of the selected MISFET. This reset pulse is a voltage pulse that heats the recording layer 52 to a temperature equal to or higher than its melting point (amorphization temperature) $T_a$ and then rapidly cools the same, and a relatively high voltage (for example, about 3 V) is applied for a relatively short time. At the time of applying the reset pulse, a relatively large current flows, and as shown in FIG. 7, the temperature of the recording layer 52 is increased to the melting point (amorphization temperature) $T_a$ of the recording layer 52 or higher to melt or amorphize the recording layer 52. When the application of the reset pulse ends, the recording layer 52 is rapidly cooled to be in an amorphous state. By shortening the reset-pulse applying time to decrease the total energy to be supplied and shortening a cooling time t to, for example, approximately 1 ns, the recording layer 52 becomes in an amorphous state with high resistance.

Conversely, when the memory information "1" is written, that is, at the time of a set operation of the phase change memory (crystallization of the recording layer 52), a set pulse as shown in FIG. 6 is applied via the bit line (wiring 72a) and the plug 64 to the resistor element 54 (recording layer 52). A fixed potential (for example, 0 V) is applied via the source wiring 37b and the plug 33 to the source (semiconductor region 22) of the MISFETs QM1 and QM2, and a predetermined voltage is applied via the word line to the gate electrode 16a of the selected MISFET. This set pulse is a voltage pulse that keeps the recording layer 52 to be in a temperature range lower than the melting point and higher than a crystallization temperature $T_c$ equal to or higher than a glass transition temperature, and a voltage lower than that of the reset pulse (for example, about 1V) is applied for a period of time longer than that of the reset pulse (equal to or longer than a crystallization time). At the time of applying a set pulse, a current lower than that at the time of reset flows for a relatively long time, and as shown in FIG. 7, the temperature of the recording layer 52 is increased to a temperature equal to or higher than the crystallization temperature $T_c$ and lower than the melting point (amorphization temperature) $T_a$ of the recording layer 52 to crystallize the recording layer 52. When the application of the set pulse ends, the recording layer 52 is cooled to be in a crystalline state (polycrystalline state). A time $t_2$ required for crystallization varies depending on the composition of the chalcogenide material forming the recording layer 52 and is, for example, approximately 50 ns. The temperature of the recording layer 52 (resistor element 54) shown in FIG. 7 depends on Joule heat generated from the recording layer 52 itself and thermal diffusion to the surroundings.

At the time of a read operation of the phase change memory, a read pulse as shown in FIG. 6 is applied via the bit line (wiring 72a) and the plug 64 to the resistor element 54 (recording layer 52). A fixed potential (for example, 0 V) is applied via the source wiring 37b and the plug 33 to the source (semiconductor region 22) of the MISFETs QM1 and QM2, and a predetermined voltage is applied via the word line to the gate electrode 16a of the selected MISFET. As the read pulse, a voltage further lower than that of the set pulse (for example, about 0.3 V) is applied for a period shorter than that of the set pulse. The voltage of the read pulse is relatively low, and even when the read pulse is applied, the temperature of the recording layer 52 is not raised to the crystallization temperature $T_c$ of the recording layer 52 or higher as shown in FIG. 7. Therefore, the phase state of the recording layer 52 is not changed. When the recording layer 52 is in a crystalline state, the recording layer 52 (resistor element 54) has a relatively low resistance, and when the recording layer 52 is in an amorphous state, the recording layer 52 (resistor element 54) has a relatively high resistance. Therefore, a current flowing through the MISFET (QM1 or QM2) to which the recording layer 52 (resistor element 54) is connected when the read pulse is applied is relatively large when the recording layer 52 is in a crystalline state and is relatively small when the recording layer 52 is in an amorphous state. Accordingly, data (whether the recording layer 52 is in a crystalline state or in an amorphous state) can be determined from the magnitude of the flowing current.

As described above, by the reset operation and the set operation to make a transition of the state of the recording layer 52 between an amorphous state and a crystalline state, recording (memorizing, storing, or writing) of data in the phase change memory can be performed. Further, with using the information indicative of whether the recording layer 52 is in an amorphous state or in a crystalline state as the memory information of the phase change memory, the data recorded in the phase change memory (memory information) can be read by the read operation. Therefore, the above-described recording layer 52 serves as a recording layer for the information of the phase change memory.

Figure 8:
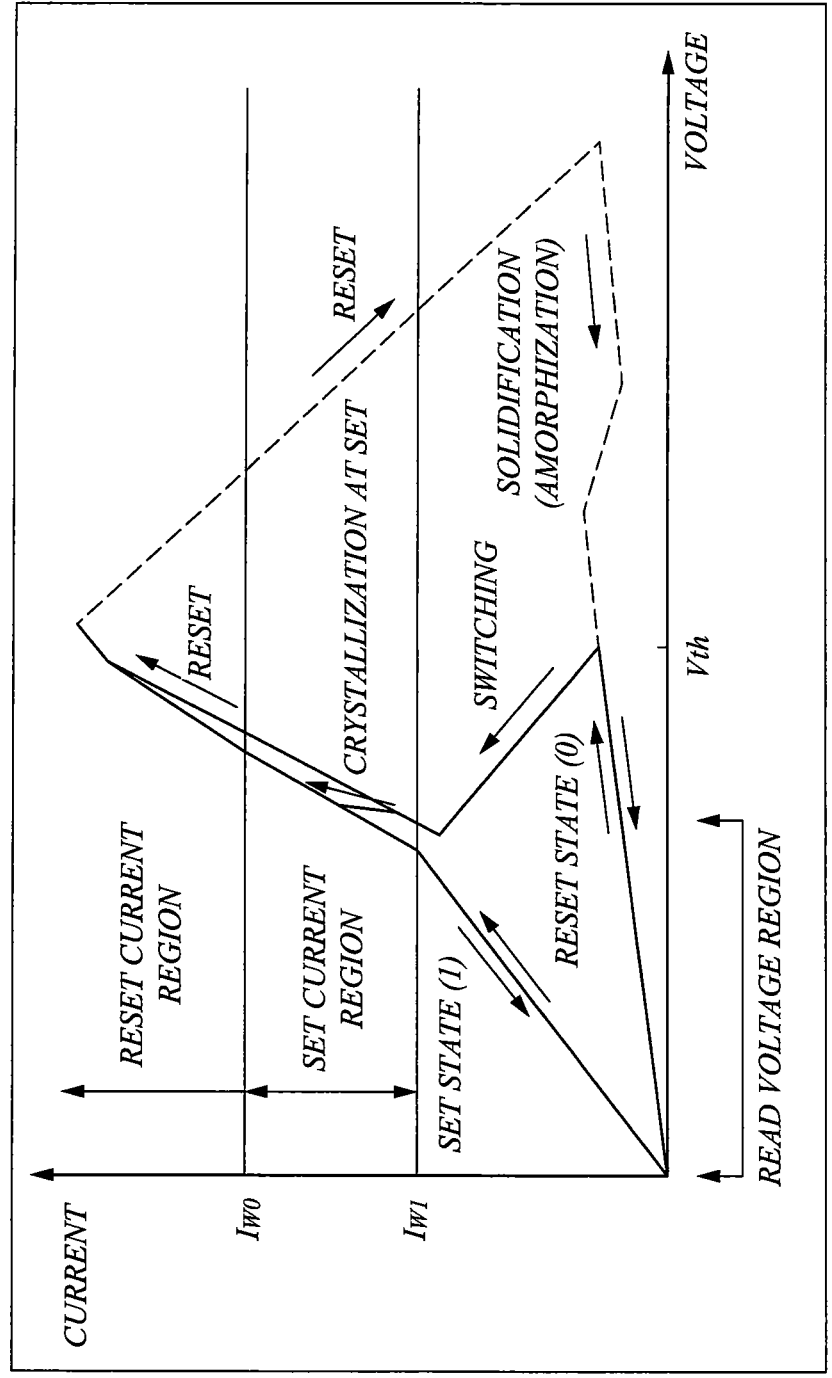
FIG. 8 is an explanatory diagram schematically showing the operation principle of the storage element using a chalcogenide material.

FIG. 8 is an explanatory diagram (graph) schematically showing the operation principles of the storage element (recording layer 52) using a chalcogenide material, and it depicts I-V characteristics of the storage element. The horizontal axis of the graph shown in FIG. 8 corresponds to a voltage applied to the storage element (recording layer 52), and the vertical axis thereof corresponds to a current flowing through the storage element (recording layer 52). FIG. 8 shows that memory information "1" is written when a set current within a range of $I_{W1}$ to $I_{W0}$ is applied, and memory information "0" is written when a reset current over $I_{W0}$ is applied. As shown in the I-V characteristics of FIG. 8, by applying a current pulse corresponding to write information to the storage element (recording layer 52), the crystalline state of the storage element is controlled. However, which state may correspond to "0" or "1". Four types of write operations will be described in detail below with reference to FIG. 8.

As can be understood from FIG. 8, firstly, in the case where "1" is written in the storage element (recording layer 52) in an initial state of "1", when a set current (set pulse) is applied, since the current goes along a low resistance curve of a set (crystalline) state between the initial state and a set region, the state is maintained. Secondly, in the case where "0" is written in the storage element (recording layer 52) in an initial state of "1", when a reset current (reset pulse) is applied, the current goes along a low resistance curve of the set state to reach a reset current. Next, since melting partially starts due to Joule heat, conductivity is gradually decreased. Furthermore, when melting proceeds, the state becomes in a high resistance state. When the storage element in the liquid phase is rapidly cooled, the phase is changed to an amorphous state, and therefore, the current goes along a high resistance curve in a reset (amorphous) state slightly lower than that of the resistance at the time of the liquid phase to return to the initial state. A dotted line in FIG. 8 is a virtual line indicating that the current is supposed to be changed that way by the changes in resistance value if the voltage is continuously applied as it is even though the reset pulse is already cut off. Thirdly, in the case where "1" is written in the storage element (recording layer 52) in an initial state of "0", when a set current (set pulse) is applied, the state is switched to a low resistance state when a terminal voltage of the storage element exceeds a threshold voltage Vth. After switching, crystallization proceeds due to Joule heat. When the current value reaches the set current, since the crystallization region is expanded to cause a phase change, the resistance value is further decreased. Therefore, the current goes along the low resistance curve to return to the initial state. The reason why tilt of the voltage-current curve becomes gentle in the middle is that the region switching to a low resistance state is switched OFF and only a decrease in resistance due to crystallization remains. Fourthly, in the case where "0" is written in the storage element (recording layer 52) in an initial state of "0", there is almost no time for crystallization after the above-described switching, and the current goes along a low resistance curve by the switching to reach the reset region and return to the initial state after melting, rapid cooling, and solidification.

Figure 9:
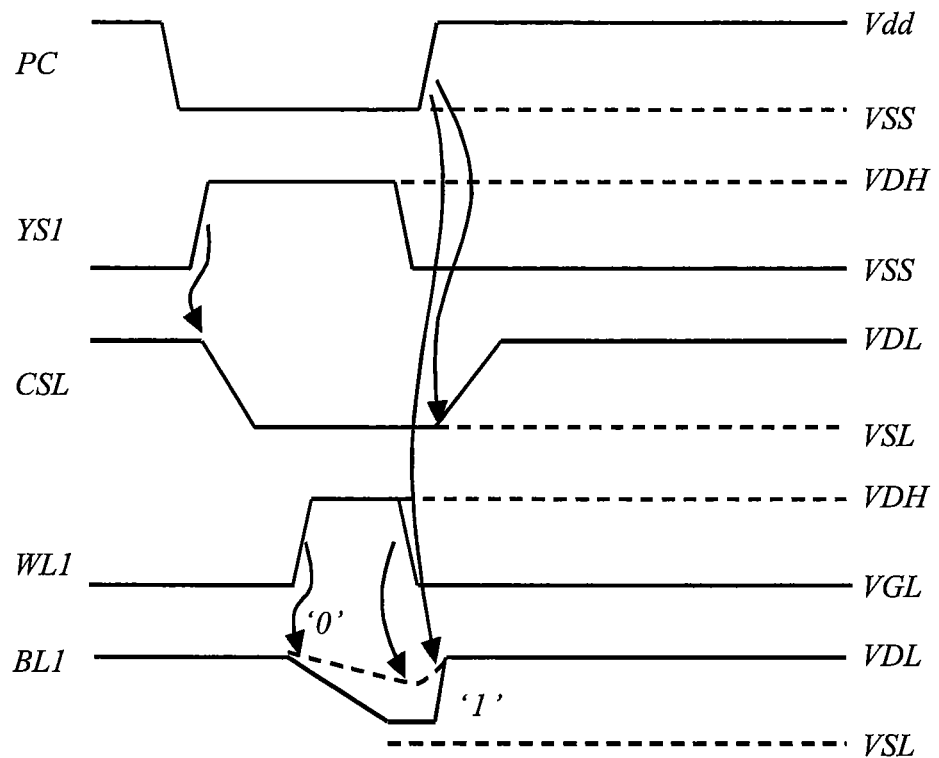
FIG. 9 is an explanatory diagram showing the read operation timing of the memory array.

Next, the read operation of a memory cell using the array configuration shown in FIG. 2 will be described with reference to FIG. 9 and above-described FIG. 2. Here, FIG. 9 shows an example of operational waveforms (applied voltage waveforms) when the memory cell MC11 is selected.

First, in a standby state, a pre-charge enable signal PC is retained at a power supply voltage Vdd (for example, 1.5 V). Therefore, the bit line BL1 is maintained at a pre-charge voltage VDL by n-channel MIS transistors (MISFETs) QC1 to QC4. The pre-charge voltage VDL mentioned here has a value dropped from Vdd by a threshold voltage of the transistor and is, for example, 1.0 V. Also, a common bit line I/O is pre-charged at the pre-charge voltage VDL.

When a read operation starts, the pre-charge enable signal PC at the power supply voltage Vdd is driven to a ground potential GND and a bit selection line YS1 at the ground potential GND (corresponding to Vss) is driven to a boosting potential VDH (for example, 1.5 V or higher), whereby a transistor (MISFET) QD1 becomes conductive. At this time, the bit line BL1 is retained at the pre-charge voltage VDL, and a source line CSL is driven to a source voltage VSL (for example, 0 V). The source voltage VSL and the pre-charge voltage VDL are set so that the pre-charge voltage VDL is higher than the source voltage VSL, and the difference therebetween is set so that a terminal voltage of a resistor R is within a range of a read voltage region as shown in FIG. 8.

Next, when the word line WL1 at the ground potential GND is driven to the boosting potential VDH, transistors (MISFETs) QMp (p=1, 2, . . . , m) in all memory cells on the word line WL1 become conductive. At this time, a current path is generated in the memory cell MC11 where a potential difference occurs at the storage element R, and a discharge occurs at the bit line BL1 toward the source voltage VSL at a speed corresponding to the resistance value of the storage element R. Since it is assumed in FIG. 9 that the resistance value at the time of retaining memory information of "1" is smaller than the resistance value at the time of retaining memory information of "0", a high-speed discharge occurs. Therefore, a signal voltage in accordance with the memory information is generated. In the non-selected memory cells MC12 to MC1m, the potential difference of the storage element R is 0, and therefore the non-selected bit lines BL2 to BL4 are retained at the pre-charge voltage VDL. In other words, only the memory cell MC11 selected by the word line WL1 and the bit line BL1 allows a read current to flow through the bit line BL1.

Note that, in a standby state, if the bit line and the source line of the memory array are in a floating state, the capacitance of the bit line with non-constant voltage is charged from the common bit line when the bit line and the common bit line are connected at the time of starting a read operation. Therefore, in FIG. 9, the bit selection line YS1 falls in accordance with the word line WL1 and further the pre-charge enable signal PC at the ground potential GND is driven to the power supply voltage Vdd, thereby driving the bit line and the source line to the pre-charge potential VDL to obtain a standby state. Also, the boosting potential VDH is set so as to satisfy a relation of VDH>Vdd+VTN by using the power supply voltage Vdd and a threshold voltage VTN of the n-channel MIS transistor. For example, in a write operation of the phase change memory, as will be described later, a current larger than that of a read operation has to flow. For this reason, in the present invention, the word line and the bit selection line are driven to the boosting potential VDH to decrease the resistance of the n-channel MIS transistor, thereby enabling an accurate write operation. Also, by setting the pre-charge voltage VDL to be higher than the source voltage VSL, the selected source line is taken as a source of the transistor (MISFET) QMm in the selected memory cell, whereby a gate-source voltage of the transistor can be ensured irrespectively of the resistance of the storage element R. Note that, even with an inverse potential relation, a similar selection operation is possible as long as the difference is set within a range of a read voltage region as shown in FIG. 8.

Note that FIG. 9 shows an example in which the source line CSL is first driven and then the word line WL1 is driven. Alternatively, depending on the convenience of design, the word line WL1 may be first driven and then the source line CSL may be driven. In this case, since the word line WL1 is first driven to cause the selected transistor QM1 to be conductive, the terminal voltage of the storage element R is kept at 0 V. Thereafter, when the source line CSL is driven, the terminal voltage of the storage element R is increased from 0 V, but the value thereof can be controlled by a driving speed of the source line CSL and can be set within a range of the above-described read region.

In the foregoing, the example of selecting the memory cell MC11 has been described, and memory cells on the same bit line are not selected because the word line voltage thereof is fixed at the ground potential GND. Also, since the other bit lines and the source line have the same potential VDL, the remaining memory cells are maintained in a state of non-selected cells.

In the description above, it is assumed that the word line in a standby state is at the ground potential GND and the source line in a selected state is at the source voltage VSL. Such a voltage relation is set so that the current flowing through unselected memory cells does not affect the operation. More specifically, the relation is set so that, when a memory cell in which the source line is selected and the word line is not selected, for example, the memory cell MC11 is selected, transistors (MISFET) QM of unselected memory cells MC21 to MCn1 are sufficiently turned off. As described herein, by setting the word line voltage in a standby state to the ground potential GND and the source voltage VSL to a positive voltage, the threshold voltage of the transistor QM can be decreased. Depending on the case, the selected source line can be set to the ground potential of 0 V, and the word line in a standby state can be set to a negative voltage. Even in that case, the threshold voltage of the transistor QM can be decreased. Although a negative voltage has to be generated for the word line in a standby state, since the voltage of the source line at the time of selection is at the ground potential GND applied externally, it can be easily stabilized. If the threshold voltage of the transistor QM is sufficiently increased, the source line at the time of selection and the word line in a standby state may be set to the ground potential of 0

V. In this case, because of the ground potential GND applied externally and the capacitance of the word line in a standby state functioning as a capacitance for stabilization, the voltage of the source line at the time of selection can be further stabilized.

Figure 10:
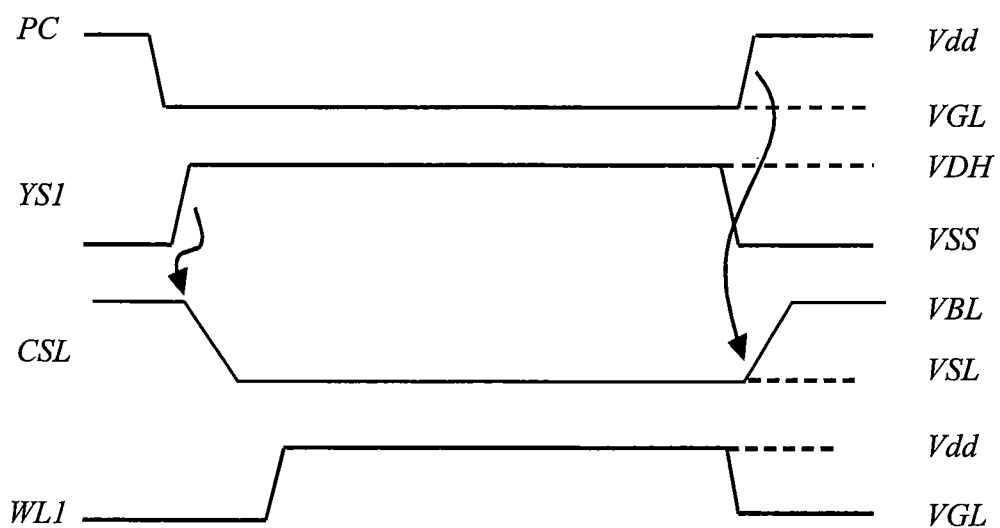
FIG. 10 is an explanatory diagram showing the write operation timing of the memory array.

Still further, a write operation of the memory cell using the array configuration shown in FIG. 2 will be described with reference to FIG. 10. Note that FIG. 10 shows operational waveforms when the memory cell MC11 is selected. First, an operation of selecting the memory cell MC11 is performed in the same manner as that of the read operation. When the memory cell MC11 is selected, a write current is generated. When "0" is written, a reset current set to a value within the range shown in FIG. 8 is applied to the memory cell MC11. The reset current has a short pulse width and returns to a standby state immediately after driving, and a current value becomes 0. By such a reset current, Joule heat identical to that of the reset pulse shown in FIGS. 6 and 7 is generated. By contrast, when "1" is written, a set current set at a value within the range shown in FIG. 8 is applied. This set current has a pulse width of approximately 50 ns. By such a set current, Joule heat identical to that of the set pulse shown in FIGS. 6 and 7 is generated. As described above, since the applying time and the current value of the write pulse are controlled by a write circuit, the memory cell is in a selected state for a period of the pulse width of the set current in the cases of writing either memory information.

Next, the resistor element 54 which is the storage element (memory element) of the semiconductor device of the present embodiment will be described in more detail below.

Figure 11:
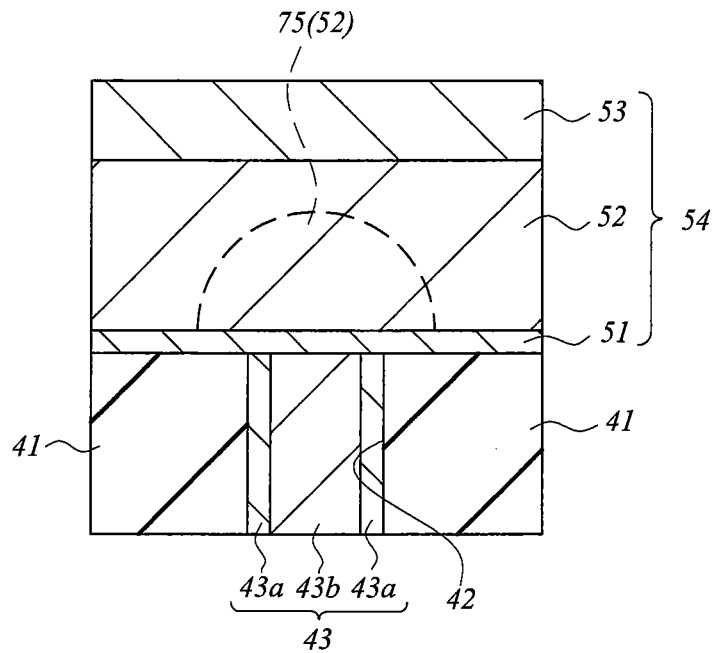
FIG. 11 is a cross-sectional view showing the principal part in the vicinity of the resistor element of the semiconductor device according to the first embodiment of the present invention.
Figure 12:
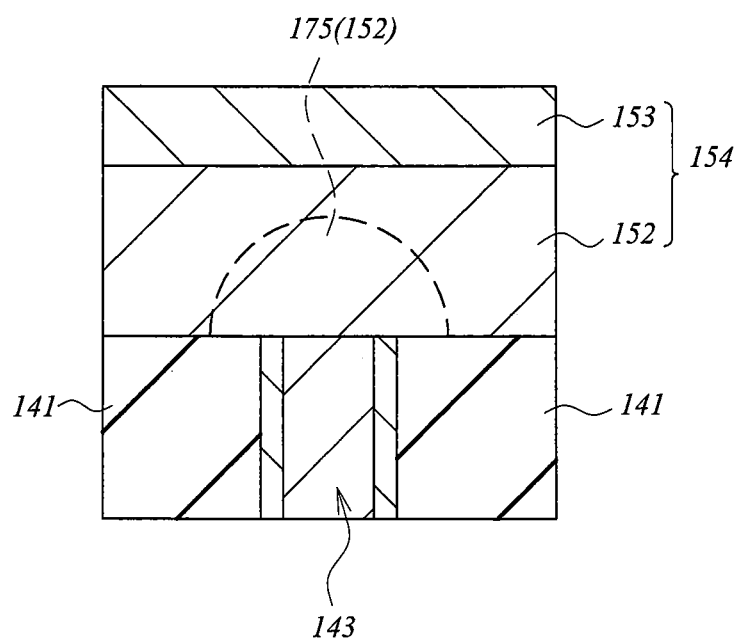
FIG. 12 is a cross-sectional view showing the principal part in the vicinity of the resistor element of the semiconductor device according to the first comparative example.
Figure 13:
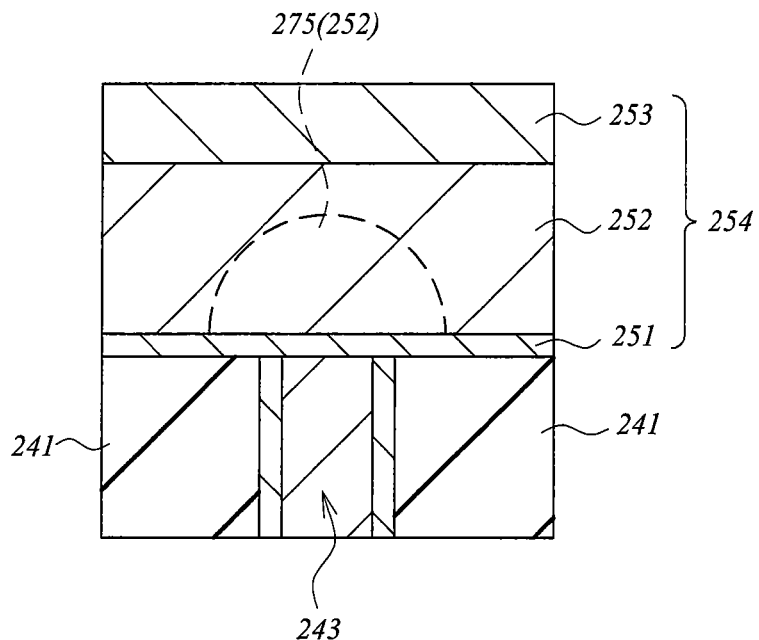
FIG. 13 is a cross-sectional view showing the principal part in the vicinity of the resistor element of the semiconductor device according to the second comparative example.

FIG. 11 is a cross-sectional view showing the principal part of the vicinity of the resistor element 54 (storage element) of the semiconductor device according to the present embodiment of FIG. 4. FIG. 12 is a cross-sectional view showing the principal part of the vicinity of a resistor element 154 (corresponding to the resistor element 54 of the present embodiment) of a semiconductor device according to a first comparative example and FIG. 13 is a cross-sectional view showing the principal part of the vicinity of a resistor element 254 (corresponding to the resistor element 54 of the present embodiment) of a semiconductor device according to a second comparative example, each of which shows the region corresponding to that of FIG. 11.

In the present embodiment, as shown in FIG. 4 and FIG. 11, the resistor element 54 has a laminated structure formed of the insulating film 51, the recording layer 52 and the upper electrode film 53 in this order from the side close to the plug 43.

In the first comparative example shown in FIG. 12, on the insulating film 41 in which a plug 143 is embedded, the resistor element 154, which is a storage element of a phase change memory, is formed of a recording layer 152 and an upper electrode film 153 on the recording layer 152. More specifically, in the first comparative example, the resistor element 154 is formed from the laminated pattern of the recording layer 152 and the upper electrode film 153, and the lower surface of the recording layer 152 is in direct contact with and electrically connected to the plug 143.

In the first comparative example, the recording layer 152 is a phase change film made of a phase change material and is made of a Ge—Sb—Te based chalcogenide material containing germanium (Ge), antimony (Sb) and tellurium (Te). The upper electrode film 153 is made of the same material as that of the upper electrode film 53 such as a tungsten (W) film or a tungsten alloy film. The plug 143 is made of the same material as that of the plug 43 such as a tungsten (W) film or a tungsten alloy film. The write operation occurs in the region near the plug 143 where Joule heat is easily generated, that is, at the interface between the plug 143 and the recording layer 152. The shape of the amorphous region (region of the recording layer 152 to be amorphous at the time of reset) 175 of the recording layer 152 in a reset state is, for example, hemispherical as schematically shown in FIG. 12.

The problems of the first comparative example are that the programming current and voltage are large and the peeling of the recording layer 152 occurs frequently. The reason why the programming current is increased is that Joule heat generated in the programming operation transmits to the plug 143. Also, the Ge—Sb—Te chalcogenide used as the material of the recording layer (material of the recording layer 152 in this case) of the phase change memory does not have good adhesiveness to an interlayer insulating film (insulating film 41) used in the semiconductor device (LSI) such as a silicon oxide film, and peeling easily occurs due to the stress caused from the metal film (upper electrode film 153 in this case) formed on the chalcogenide layer (recording layer 152 in this case).

Therefore, in the second comparative example shown in FIG. 13, on the insulating film 41 in which a plug 243 is embedded, the resistor element 254, which is a storage element of a phase change memory, is formed of an insulating film 251, a recording layer 252 on the insulating film 251 and an upper electrode film 253 on the recording layer 252. More specifically, in the second comparative example, the resistor element 254 is formed from the laminated pattern of the insulating film 251, the recording layer 252 and the upper electrode film 253, and the insulating film 251 is interposed between the recording layer 252 and the plug 243.

In the second comparative example, similar to the recording layer 152, the recording layer 252 is a phase change film made of a phase change material and is made of a Ge—Sb—Te based chalcogenide material containing germanium (Ge), antimony (Sb) and tellurium (Te). The upper electrode film 253 is made of the same material as those of the upper electrode films 53 and 153 such as a tungsten (W) film or a tungsten alloy film. Similar to the insulating film 51, the insulating film 251 is made of tantalum oxide or the like. The plug 243 is made of the same material as the plug 43 such as a tungsten (W) film or a tungsten alloy film.

Tantalum oxide (insulating film 251) has lower thermal conductivity than the plug 243 and has a function to reduce the programming current. Further, tantalum oxide (insulating film 251) has good adhesiveness to Ge—Sb—Te chalcogenide and has a function to prevent the peeling of the chalcogenide layer (recording layer 252). Therefore, it is preferable to interpose the thin insulating film 251 (as an interface layer) (at the interface) between the recording layer 252 and the plug 243 as a lower electrode as shown in the second comparative example. For the prevention of the peeling, the insulating film 251 with a thickness of, for example, about 2 nm is preferably used. Further, the shape of the amorphous region (region of the recording layer 252 to be amorphous at the time of reset) 275 of the recording layer 252 in a reset state is, for example, hemispherical as schematically shown in FIG. 13.

However, the tantalum interface layer (insulating film 251) affects the programming characteristics of the phase change memory. In other words, when the insulating film 251 is interposed (at the interface) between the recording layer 252 and the plug 243 as a lower electrode as shown in the second comparative example, the programming characteristics of the phase change memory are affected.

One example of the specific influences is the change in programming characteristics caused by the reduction of the difference in the work function between $Ge_2Sb_2Te_5$ as a chalcogenide material (recording layer 252) and the insulating film interface layer (tantalum oxide interface layer, insulating film 251). When the difference in the work function between the chalcogenide material (recording layer 252) and a material in contact therewith is reduced, the band bending of the chalcogenide at the bonding interface (bonding interface between the recording layer 252 of the chalcogenide and a material in contact therewith) is decreased, and the programming voltage necessary for the band bending required to excite the phase change is increased.

The chalcogenide material used for the recording layer 252 of the phase change memory is Ge—Sb—Te based chalcogenide such as $Ge_2Sb_2Te_5$. The Ge—Sb—Te crystal ("Ge—Sb—Te based chalcogenide" is simply referred to as "Ge—Sb—Te" or "GST") is p-type semiconductor, and the work function thereof is located between the valence band and the band gap.

Figure 14:
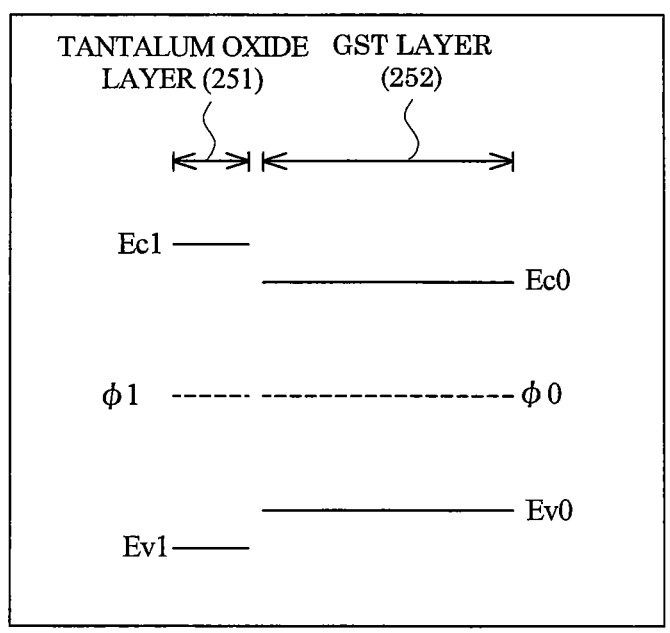
FIG. 14 is a band structure diagram of a tantalum oxide layer and a normal GST layer to which indium is not added in the flat band state.

On the other hand, although an insulating film having low thermal conductivity (tantalum oxide or others) is used for the material (insulating film 251) in contact with Ge—Sb—Te (recording layer 252), as schematically shown in the band structure diagram of FIG. 14, when the work function thereof is almost the same as that of Ge—Sb—Te (namely, when the insulating film 251 and the recording layer 252 have almost the same work function), the band bending of Ge—Sb—Te (recording layer 252) by the bonding between Ge—Sb—Te (recording layer 252) and the contact material (insulating layer 251) thereof does not occur. Therefore, the phase change caused by the impact ionization due to the band bending of Ge—Sb—Te (phase change of the recording layer 252) is difficult to occur.

The deterioration in the programming characteristics due to the bonding between the insulating film interface layer (insulating film 251) and the chalcogenide material (recording layer 252) is one of the problems of the phase change memory to be solved. There is the possibility that the reduction of the band bending of chalcogenide (recording layer 252) causes the increase in the switching voltage, the decrease in reliability and the reduction in yield of the phase change memory. Therefore, when the insulating film 251 is interposed (at the interface) between the recording layer 252 and the plug 243 as a lower electrode as shown in the second comparative example, it is possible to achieve the effect of preventing the peeling of the chalcogenide layer (recording layer 252) by the insulating film 251 and the effect of reducing the programming current by preventing the thermal conduction by the insulating film 251, but there is the possibility that programming characteristics are deteriorated (programming voltage is increased) as described above.

On the other hand, in the present embodiment, as shown in FIG. 4 and FIG. 11, the insulating film 51, the recording layer 52 and the upper electrode film 53 are formed (laminated) in this order from the side close to the plug 43 on the insulating film 41 in which the plug 43 as the lower electrode (metal lower electrode) is embedded. More specifically, the insulating film 51, the recording layer 52 and the upper electrode film 53 are sequentially formed on the plug 43 as the lower electrode (metal lower electrode), thereby forming the resistor element 54 which is the storage element of the phase change memory. As described above, the semiconductor device of the present embodiment has the plug 43 as the lower electrode formed on the semiconductor substrate 11, the insulating film 51 (first insulating film) formed on the plug 43 (lower electrode), the recording layer 52 formed on the insulating film 51, and the upper electrode film 53 formed on the recording layer 52. Therefore, the resistor element 54 which forms the storage element of the phase change memory is formed from the laminated pattern of the insulating film 51, the recording layer 52 and the upper electrode film 53, and the insulating film 51 is interposed between the plug 43 as the lower electrode of the phase change memory and the recording layer 52. Further, the recording layer 52 is a phase change film made of a phase change material whose resistance value is changed through the heat treatment, and Ge—Sb—Te based chalcogenide material to which indium (In) is introduced (added) is used as the material for forming the recording layer 52 in the present embodiment. More specifically, the recording layer 52 is made of Ge—Sb—Te based chalcogenide to which indium is introduced.

The Ge—Sb—Te based chalcogenide material to which indium (In) is introduced (added) (that is, the material for forming the recording layer 52) mentioned here is obtained by introducing (adding) indium (In) to chalcogenide containing at least germanium (Ge), antimony (Sb) and tellurium (Te) (that is, Ge—Sb—Te based chalcogenide). Therefore, the material for forming the recording layer 52 (Ge—Sb—Te based chalcogenide material to which indium (In) is introduced (added)) contains at least germanium (Ge), antimony (Sb), tellurium (Te) and indium (In) as constituent elements thereof. Therefore, the recording layer 52 is made of a phase change material having Ge (germanium), Sb (antimony), Te (tellurium) and In (indium) as constituent elements thereof. In the following description, "Ge—Sb—Te based chalcogenide to which indium (In) is introduced (added)" is referred to as "indium-added GST" for simplification.

One example of the composition of the indium-added GST for forming the recording layer 52 contains In (indium) of about 20 atom %, Ge (germanium) of about 15 atom %, Sb (antimony) of about 10 atom % and Te (tellurium) of about 55 atom %.

As a material for forming the insulating film 51, preferably, metal oxide (oxide of transition metal) is used and more preferably, tantalum oxide (for example, $Ta_2O_5$ or material with close composition to $Ta_2O_5$) is used. Therefore, the insulating film 51 is preferably made of metal oxide and more preferably made of tantalum oxide.

The plug 43 functions as a lower electrode of the phase change memory, and the lower portion of the resistor element 54 (lower surface of the insulating film 51) is in contact with and electrically connected to the plug 43. In the present embodiment, the lower electrode (plug 43) is made of tungsten (tungsten plug) as described above. The lower electrode (plug 43) is embedded in the opening (through hole 42) formed in the insulating film 41 (second insulating film) formed on the semiconductor substrate 11, and the insulating film 51 (first insulating film) is formed on the insulating film 41 in which the lower electrode (plug 43) is embedded.

The Joule heat necessary for the rewrite operation is generated in the vicinity of the plug 43. The shape of the amorphous region (region of the recording layer 52 to be amorphous at the time of reset) 75 of the recording layer 52 in a reset state is, for example, hemispherical as schematically shown in FIG. 13.

Tantalum oxide (insulating film 51) has low thermal conductivity compared with the plug 43 (tungsten or others), and exerts an effect of reducing the programming current. This is because the insulating film 51 (tantalum oxide) having the thermal conductivity lower than that of the plug 43 can prevent the Joule heat generated in the programming operation (reset operation or set operation) from transmitting to the plug 43. Furthermore, tantalum oxide (insulating film 51) has good adhesiveness to chalcogenide (recording layer 52) and can exert the effect of preventing the peeling of the recording layer 52.

When the field is generated inside chalcogenide by the band bending of chalcogenide (corresponding to the recording layer 52 in the present embodiment), the impact ionization occurs and the charge is multiplied to generate Joule heat, whereby the programming of the phase change memory occurs. For the reduction of the programming voltage, it is effective to increase the difference in work function between the chalcogenide layer (recording layer 52) and the interface layer (insulating film 51) and to cause the band bending of the chalcogenide (recording layer 52) in advance before applying the programming voltage.

Note that the programming voltage corresponds to the difference between the voltage applied to the upper electrode film 53 side of the resistor element 54 constituting the phase change memory via the wiring (bit line) 72a and the plug 64 and the voltage applied to the lower electrode (plug 43 in this case) side of the phase change memory via the MISFETs QM1 and QM2 to which the resistor element 54 is connected at the time of the programming (that is, in the reset operation or the set operation) of the resistor element 54. Further, the programming current corresponds to the current flowing through the resistor element 54 (current flowing between the upper electrode film 53 and the plug 43) at the time of the programming (that is, in the reset operation or the set operation) of the resistor element 54.

It is effective for the increase of the difference in work function between the chalcogenide layer (recording layer 52) and the interface layer (insulating film 51) to increase the work function of the chalcogenide layer (recording layer 52), and is also effective to reduce the work function of the interface layer (insulating film 51). In the present embodiment, the work function of the chalcogenide layer (recording layer 52) is increased by the use of the indium-added GST.

Figure 15:
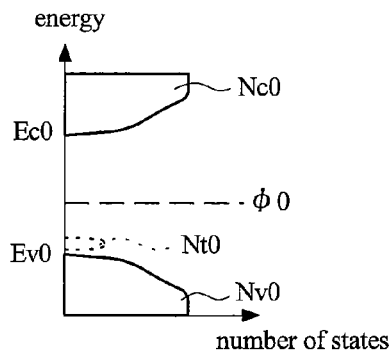
FIG. 15 is a band structure diagram of the normal GST to which indium is not added.

FIG. 15 shows the band structure of the normal Ge—Sb—Te based chalcogenide (hereinafter, referred to as GST) to which indium is not introduced. The horizontal axis of the band structure shown in FIG. 15 corresponds to the number of states (state density) and the vertical axis corresponds to the energy. The band structure diagram of GST in FIG. 15 shows the state density Nc0 of the conduction band, the state density Nv0 of the valence band, the work function $\phi 0$ (work function $\phi 0$ almost corresponds to Fermi level) and the state density Nt0 by the level caused by the defects or others. Further, Ev0 corresponds to the energy at the end of the valence band (upper end of the valence band), and Ec0 corresponds to the energy at the end of the conduction band (lower end of the conduction band).

The GST crystal is p-type semiconductor. As schematically shown in FIG. 15, the work function $\phi 0$ of GST is located above the energy Ev0 at the end of the valence band. In the band gap of the indium-added GST, the state density Nt0 by the level caused by the defects or others can be formed, but this state density Nt0 is smaller than the state densities Nt2, Nt3 and Nt4 described later. Since the state density Nt0 is small, the work function $\phi 0$ of GST (Fermi level) is located at a position apart from the upper end of the valence band Ev0 to some extent.

Figure 16:
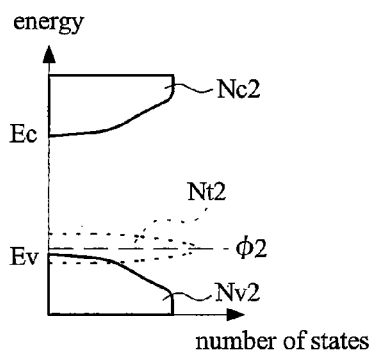
FIG. 16 is a band structure diagram of the indium-added GST.

FIG. 16 shows the band structure of the indium-added GST. The horizontal axis of the band structure in FIG. 16 corresponds to the number of states (state density) and the vertical axis corresponds to the energy. The band structure diagram of the indium-added GST in FIG. 16 shows the state density Nc2 of the conduction band, the state density Nv2 of the valence band, the work function $\phi 2$ (work function $\phi 2$ almost corresponds to Fermi level) and the state density Nt2 described later. Further, Ev corresponds to the energy at the end of the valence band (upper end of the valence band), and Ec corresponds to the energy at the end of the conduction band (lower end of the conduction band).

The indium-added GST is p-type semiconductor. The work function $\phi 2$ of indium-added GST is larger than the work function $\phi 0$ of the normal GST and is close to the energy Ev at the end of the valence band. In other words, the work function $\phi 2$ of the indium-added GST is located at a position closer to the energy (Ev0, Ev) at the end of the valence band than the work function $\phi 0$ of the normal GST.

The band structure of the indium-added GST is characterized in that the state density Nt2 in the band gap of the indium-added GST caused by indium (In) is present in the vicinity of the valence band (upper end of the valence band Ev) as shown in FIG. 16. This state density Nt2 corresponds to the atomic level of indium (In). By the introduction (addition) of indium (In) to GST, the state density Nt2 corresponding to (caused by) the atomic level of indium (In) is formed in the vicinity of the valence band (upper end of valence band Ev), whereby the Fermi level moves toward the valence band (upper end of the valence band Ev) side (that is, Fermi level is reduced), and the work function $\phi 2$ is increased. In other words, the work function $\phi 2$ of the indium-added GST becomes larger than the work function $\phi 0$ of the normal GST to which indium (In) is not introduced (added). By using the indium-added GST with a large work function as the material of the recording layer 52, the effect of reducing the programming voltage can be achieved as described in detail below.

Figure 17:
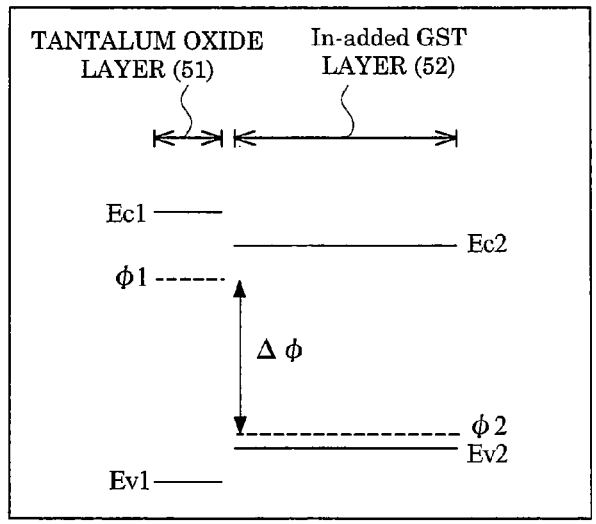
FIG. 17 is a band structure diagram of a tantalum oxide layer and the indium-added GST layer in the flat band state.

FIG. 17 shows the band structure of the tantalum oxide interface layer (insulating film 51) and the indium-added GST layer (recording layer 52). For the easy understanding, FIG. 17 shows the band diagram in the flat band state (state where the tantalum oxide interface layer (insulating film 51) and the indium-added GST layer (recording layer 52) are not bonded). Note that FIG. 14 described above also shows the band diagram in the flat band state (state where the tantalum oxide layer (insulating film 251) and the GST layer (recording layer 252) are not bonded).

In FIG. 17, the work function $\phi 1$ of tantalum oxide is located in the band gap of the indium-added GST. More specifically, the Fermi level of the indium-added GST (recording layer 52) is lower than the Fermi level of the tantalum oxide interface layer (insulating film 51), and the work function $\phi 1$ of the tantalum oxide interface layer (insulating film 51) is smaller than the work function $\phi 2$ of the indium-added GST (recording layer 52). FIG. 17 schematically shows the difference (work function difference) $\Delta \phi$ between the work function $\phi 2$ of the indium-added GST (recording layer 52) and the work function $\phi 1$ of the tantalum oxide interface layer (insulating film 51) (here, $\Delta \phi = |\phi 2 - \phi 1|$). In this case, not only the increase of the work function $\phi 2$ of the recording layer 52 by the use of the indium-added GST but also the reduction of the work function $\phi 1$ of tantalum oxide (insulating film 51) are effective for the reduction of the programming voltage. In other words, not only the increase of the work function $\phi 2$ of the recording layer 52 but also the reduction of the work function of the insulating film 51 can reduce the programming voltage of the phase change memory.

Figure 18:
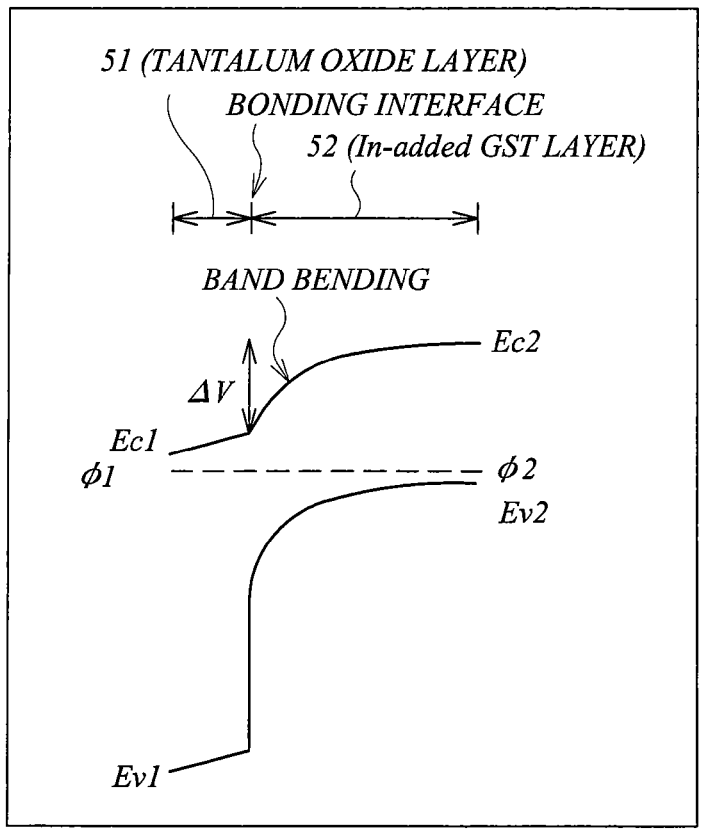
FIG. 18 is a band structure diagram in the case where a tantalum oxide layer and the indium-added GST layer are bonded.

FIG. 18 shows the band structure bent by the work function difference $\Delta \phi$ between the tantalum oxide interface layer (insulating film 51) and the indium-added GST. More specifically, FIG. 18 is a band structure diagram in the case where the tantalum oxide interface layer (insulating film 51) and the indium-added GST layer (recording layer 52) are bonded, and it shows the state where the band structure of the indium-added GST is bent in the vicinity of the bonding interface due to the work function difference $\Delta \phi$ between the tantalum oxide interface layer (insulating film 51) and the indium-added GST (recording layer 52). In the present embodiment, since the recording layer made of indium-added GST is disposed on the insulating film 51 made of tantalum oxide to form the phase change memory, the tantalum oxide layer (insulating film 51) and the indium-added GST layer (recording layer 52) for forming the phase change memory are bonded, and the band structure as shown in FIG. 18 is formed in the vicinity of the bonding interface between the insulating film 51 and the recording layer 52. Therefore, FIG. 18 almost corresponds to the band structure in the vicinity of the bonding interface between the insulating film 51 and the recording layer 52 of the phase change memory of the present embodiment (band structure in the state where no voltage is applied to the resistor element 54), and the horizontal axis of FIG. 18 corresponds to the position in the thickness direction of the insulating film 51 and the recording layer 52 and the vertical axis corresponds to the energy.

As shown in FIG. 18, in the vicinity of the bonding interface between the tantalum oxide interface layer (insulating film 51) and the indium-added GST (recording layer 52), the band of the indium-added GST is bent by only $\Delta V$. This is because the band in the vicinity of the bonding interface is bent so that the Fermi level of the tantalum oxide interface layer (insulating film 51) is matched with the Fermi level of the indium-added GST (recording layer 52) at the bonding interface. The magnitude of the band bending $\Delta V$ becomes larger as the work function difference $\Delta \phi$ between the insulating film 51 (tantalum oxide interface layer) and the recording layer 52 (indium-added GST) as shown in FIG. 17 becomes larger. Therefore, the reduction of the programming voltage corresponding to the band bending $\Delta V$ generated by the difference in work function ($\Delta \phi$) between tantalum oxide (insulating film 51) and indium-added GST (recording layer 52) can be achieved.

More specifically, in the case where the insulating film 51 made of tantalum oxide and the recording layer 52 made of indium-added GST are laminated as described in the present embodiment, the work function ($\phi 2$) of the recording layer 52 is increased by the introduction (addition) of indium, and the difference in work function ($\Delta \phi$) between the insulating film 51 and the recording layer 52 is thus increased more than the case where the insulating film 251 made of tantalum oxide and the recording layer 252 made of GST are laminated as described in the second comparative example. Therefore, since the band bending (band bending amount) $\Delta V$ of the recording layer 52 in the vicinity of the bonding interface between the insulating film 51 and the recording layer 52 is increased, the programming voltage can be reduced more in the present embodiment than the second comparative example.

As described above, when the field is generated inside the chalcogenide layer by the band bending of the chalcogenide layer (corresponding to the recording layer 52 in the present embodiment), the impact ionization occurs and the charge is multiplied to generate Joule heat, whereby the programming of the phase change memory occurs. In the present embodiment, the recording layer 52 is made of indium-added GST, thereby increasing the work function ($\phi 2$) of the recording layer 52 to increase the difference in work function ($\Delta \phi$) between the insulating film 51 and the recording layer 52, and thus the band bending $\Delta V$ of the recording layer 52 in the vicinity of the bonding interface between the insulating film 51 and the recording layer 52 is increased. Therefore, since the band of the recording layer 52 is already bent by $\Delta V$ even in the state where no voltage is applied to the resistor element 54 as shown in FIG. 18, the voltage which is lower by about $\Delta V$ than the voltage to be applied when the band bending is zero ($\Delta V=0$) may be applied to the upper electrode film 53 side of the resistor element 54 at the time of programming, and the programming voltage can be reduced by the voltage almost corresponding to $\Delta V$. More specifically, in the present embodiment, since the band bending $\Delta V$ in the state where no voltage is applied between both ends of the resistor element 54 is increased by forming the recording layer 52 from indium-added GST, the programming voltage which is the voltage actually applied between the both ends of the resistor element 54 at the time of programming can be reduced.

As described above, since the insulating film 51 is interposed between the plug 43 (lower electrode) and the recording layer 52 in the present embodiment, the effect of reducing the programming current of the phase change memory by the heat insulation by the insulating film 51 and the effect of preventing the peeling of the recording layer 52 by the insulating film 51 can be achieved. Furthermore, the problem of the increase of the programming voltage due to the reduction of the band bending of the chalcogenide recording layer caused by the contact with the insulating film (tantalum oxide layer) (problem described in the second comparative example) is dealt with by using indium-added GST for the recording layer 52. By this means, it is possible to reduce the programming voltage of the phase change memory. Accordingly, in addition to the reduction of the programming current of the phase change memory and the prevention of the peeling of the chalcogenide recording layer, the reduction of the programming voltage of the phase change memory and the improvement of the performance and reliability of the semiconductor device having the phase change memory can be achieved. Further, effects such as the reduction of the variation in the drive voltage of the phase change memory, increase in the number of rewrites, higher integration, the drive by logic CMOS (CMISFET) and the improvement in manufacturing yield can be achieved.

The ratio (proportion) of indium (In) in the recording layer 52 made of indium-added GST, that is, the amount of indium (In) introduced (added) to the indium-added GST constituting the recording layer 52 is preferably 10 atom % or more because the state density Nt2 can be sufficiently larger than the state density Nt0 and the work function $\phi 2$ of the recording layer 52 can be made lower than the work function $\phi 0$ of the normal GST and the reduction effect of the programming voltage can be appropriately obtained. Further, in order to maintain the function of the recording layer 52 as the phase change film, the ratio (proportion) of indium (In) in the recording layer 52 made of indium-added GST is preferably 30 atom % or less.

Also, the work function of the interface layer (insulating film 51) can be further reduced by doping (introducing, adding) metal to the interface layer (insulating film 51). For example, by diffusing a small amount of tungsten (W) constituting the plug 43 into the insulating film 51 by controlling the process annealing conditions, the work function ($\phi 1$) of tantalum oxide (insulating film 51) can be reduced.

Figure 19:
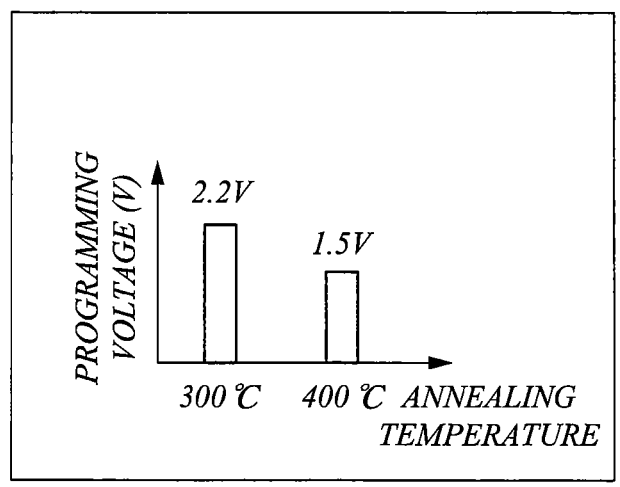
FIG. 19 is a graph showing the influence on the programming voltage by the film formation temperature of the silicon oxide film formed on the indium-added GST.

FIG. 19 shows the influence on the programming voltage by the film formation temperature of the silicon oxide film formed on the indium-added GST. In other words, FIG. 19 shows the programming voltage of the phase change memory in the case where a recording layer of the phase change memory is formed from indium-added GST and a silicon oxide film as an interlayer insulating film is formed thereon at the film formation temperature of 300° C. and at the film formation temperature of 400° C. The horizontal axis of the graph in FIG. 19 corresponds to the film formation temperature (annealing temperature) of the silicon oxide film and the vertical axis of FIG. 19 corresponds to the programming voltage of the phase change memory.

As is understood from the graph of FIG. 19, the programming voltage (for example, about 1.5 V) in the case where the film formation temperature of the silicon oxide film is 400° C. is lower than the programming voltage (for example, about 2.2 V) in the case where the film formation temperature of the silicon oxide film is 300° C. This is because tungsten constituting the plug 43 is slightly diffused in the insulating film 51 by the heat treatment in forming the silicon oxide film and the work function of tantalum oxide (insulating film 51) is thus reduced. More specifically, this is considered to be due to that tungsten constituting the plug 43 is diffused more in the case of 400° C. than the case of 300° C. into the insulating film 51 by the heat treatment in forming the silicon oxide film and the work function of the insulating film 51 is reduced by this diffusion, so that the difference in work function ($\Delta\phi$) between the insulating film 51 and the recording layer 52 is increased and the programming voltage is reduced. In the present embodiment, the process step for reducing the work function of the interface layer (insulating film 51) is present, and the programming voltage can be further reduced by the combination of the tungsten lower electrode (lower electrode made of tungsten, plug 43 in this case) and the tantalum oxide (insulating film 51).

Therefore, in the present embodiment, the metal element (tungsten in this case) constituting the lower electrode (plug 43 in this case) is preferably diffused in the insulating film 51, whereby the programming voltage of the phase change memory can be further reduced. However, it is desired that the amount of metal (tungsten in this case) diffused into the insulating film 51 from the lower electrode (plug 43) is extremely small. This is because the insulating film 51 becomes metallic when the amount of metal diffused into the insulating film 51 from the plug 43 is large, and the heat insulation effect by the insulating film 51 is decreased.

As described above, the indium-added GST (recording layer 52) has a work function (Fermi level) in the vicinity of the band end (Ev) of the valence band, that is, a large work function ($\phi 2$). The tungsten lower electrode (plug 43) has an effect of reducing the work function of tantalum oxide (insulating film 51) by controlling the annealing conditions in the process step so as to diffuse an appropriate amount of tungsten into tantalum oxide (insulating film 51). Further, tantalum oxide (insulating film 51) has the characteristics of preventing the peeling of the chalcogenide layer (recording layer 52) and preventing (reducing) the programming current. By the combination of these three materials, the optimum band bending of the chalcogenide (recording layer 52) can be obtained. When summarized, in the cell structure (of the phase change memory) in which the tungsten lower electrode (plug 43), the tantalum oxide (insulating film 51) and the indium-added GST (recording layer 52) are combined, the reduction of the programming voltage can be achieved at the same time with the prevention of the peeling of chalcogenide (recording layer 52) and the reduction of the programming current. By the combination described above, the operation by, for example, the voltage of 1.5 V required for the logic CMOS (CMISFET) operation can be realized (even in the phase change memory).

Next, a manufacturing process of the semiconductor device 1 according to the present embodiment will be described with reference to the drawings. FIGS. 20 to 29 are cross-sectional views showing the principal part of the semiconductor device 1 according to the present embodiment in the manufacturing process, in which the region corresponding to that of FIG. 4 is shown. Note that, for the easy understanding, in FIGS. 24 to 29, the illustration of the insulating film 31 and portions corresponding to the structure therebelow in FIG. 23 is omitted.

Figure 20:
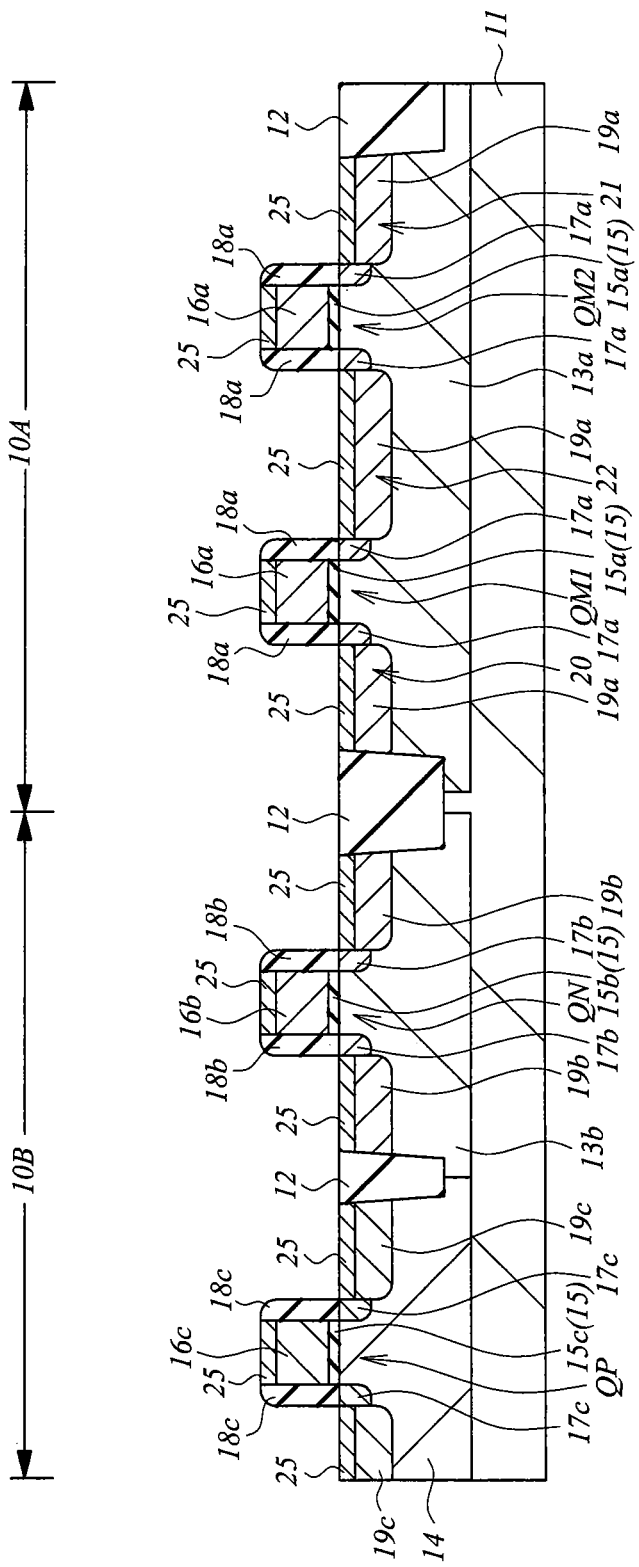
FIG. 20 is a cross-sectional view showing the principal part in the manufacturing process of the semiconductor device according to the first embodiment of the present invention.

First, as shown in FIG. 20, the semiconductor substrate (semiconductor wafer) 11 made of, for example, p-type single-crystal silicon is prepared. Then, in the main surface of the semiconductor substrate 11, the isolation regions 12 made of an insulating material are formed by, for example, STI (Shallow Trench Isolation) or LOCOS (Local Oxidization of Silicon) method. By the formation of the isolation regions 12, active regions whose periphery is defined by the isolation regions 12 are formed on the main surface of the semiconductor substrate 11.

Next, the p-wells 13a and 13b and the n-well 14 are formed in the main surface of the semiconductor substrate 11. Of these, the p-well 13a is formed in the phase change memory region 10A, and the p-well 13b and the n-well 14 are formed in the peripheral circuit region 10B. For example, the p-wells 13a and 13b can be formed by the ion implantation of p-type impurities (for example, boron (B)) into a part of the semiconductor substrate 11, and the n-well 14 can be formed by the ion implantation of n-type impurities (for example, phosphorus (P) or arsenic (As)) into another part of the semiconductor substrate 11.

Next, by using thermal oxidation or the like, an insulating film 15 for a gate insulating film formed of a thin silicon oxide film is formed on the surfaces of the p-wells 13a and 13b and the n-well 14 of the semiconductor substrate 11. As the insulating film 15, a silicon oxynitride film or the like can be used. The insulating film 15 has a film thickness of, for example, about 1.5 to 10 nm.

Next, the gate electrodes 16a, 16b and 16c are formed on the insulating film 15 of the p-wells 13a and 13b and the n-well 14. For example, the gate electrodes 16a, 16b, and 16c formed of the patterned polycrystalline silicon film (conductive film) can be formed by forming a polycrystalline silicon film with a low resistance as a conductive film on the entire main surface of the semiconductor substrate 11 including the insulating film 15, and then patterning the polycrystalline silicon film by a photoresist method and dry etching. The insulating film 15 remaining under the gate electrode 16a serves as the gate insulating film 15a, the insulating film 15 remaining under the gate electrode 16b serves as the gate insulating film 15b, and the insulating film 15 remaining under the gate electrode 16c serves as the gate insulating film 15c. Note that, by doping impurities at the time of or after the film formation, the gate electrodes 16a and 16b are formed of a polycrystalline silicon film to which n-type impurities are introduced (doped polysilicon film), and the gate electrode 16c is formed of a polycrystalline silicon film to which p-type impurities are introduced (doped polysilicon film).

Next, by the ion implantation of n-type impurities such as phosphorus (P) or arsenic (As), the n$^-$-type semiconductor regions 17a are formed in the regions on both sides of the gate electrode 16a of the p-well 13a, and the n$^-$-type semiconductor regions 17b are formed in the regions on both sides of the gate electrode 16b of the p-well 13b. Also, by the ion implantation of p-type impurities such as boron (B), the p$^-$-type semiconductor regions 17c are formed in the regions on both sides of the gate electrode 16c of the n-well 14.

Next, the sidewalls 18a, 18b and 18c are formed on the sidewalls of the gate electrodes 16a, 16b and 16c. These sidewalls 18a, 18b and 18c can be formed by, for example, depositing an insulating film formed of a silicon oxide film, a silicon nitride film, or a laminated film thereof on the semiconductor substrate 11 and then performing anisotropic etching to this insulating film.

Next, by the ion implantation of n-type impurities such as phosphorus (P) or arsenic (As), the n$^+$-type semiconductor regions 19a are formed in the regions on both sides of the gate electrode 16a and the sidewalls 18a of the p-well 13a, and the n$^+$-type semiconductor regions 19b are formed in the regions on both sides of the gate electrode 16b and the sidewalls 18b of the p-well 13b. Further, by the ion implantation of p-type impurities such as boron (B), the p$^+$-type semiconductor regions 19c are formed in the regions on both sides of the gate electrode 16c and the sidewalls 18c of the n-well 14. After the ion implantation, annealing (heat treatment) can be performed for activating the introduced impurities.

By this means, in the phase change memory region 10A, the n-type semiconductor regions 20 and 21 functioning as drain regions of the MISFETs QM1 and QM2 and the n-type semiconductor region 22 functioning as a common source region thereof are formed from the n$^+$-type semiconductor regions 19a and the n$^-$-type semiconductor regions 17a, respectively. Also, in the peripheral circuit region 10B, the n-type semiconductor region functioning as a drain region of the MISFET QN and the n-type semiconductor region functioning as a source region thereof are formed from the n$^+$-type semiconductor regions 19b and the n$^-$-type semiconductor regions 17b, respectively, and the p-type semiconductor region functioning as a drain region of the MISFET QP and the p-type semiconductor region functioning as a source region thereof are formed from the p$^+$-type semiconductor regions 19c and the p$^-$-type semiconductor regions 17c, respectively.

Next, the surfaces of the gate electrodes 16a, 16b and 16c, the n$^+$-type semiconductor regions 19a and 19b and the p$^+$-type semiconductor region 19c are exposed, and a metal film such as a cobalt (Co) film is deposited thereon and subjected to heat treatment, thereby forming the metal silicide layer 25 on each of the surfaces of the gate electrodes 16a, 16b and 16c, the n$^+$-type semiconductor regions 19a and 19b and the p$^+$-type semiconductor region 19c. Thereafter, an unreacted cobalt film (metal film) is removed.

In this manner, the structure shown in FIG. 20 can be obtained. Through the processes described above, the n-channel MISFETs QM1 and QM2 are formed in the phase change memory region 10A, and the n-channel MISFET QN and the p-channel MISFET QP are formed in the peripheral circuit region 10B. Therefore, the MISFETs QM1 and QM2 in the phase change memory region 10A and the MISFETs QN and QP in the peripheral circuit region 10B can be formed through the same manufacturing processes.

Figure 21:
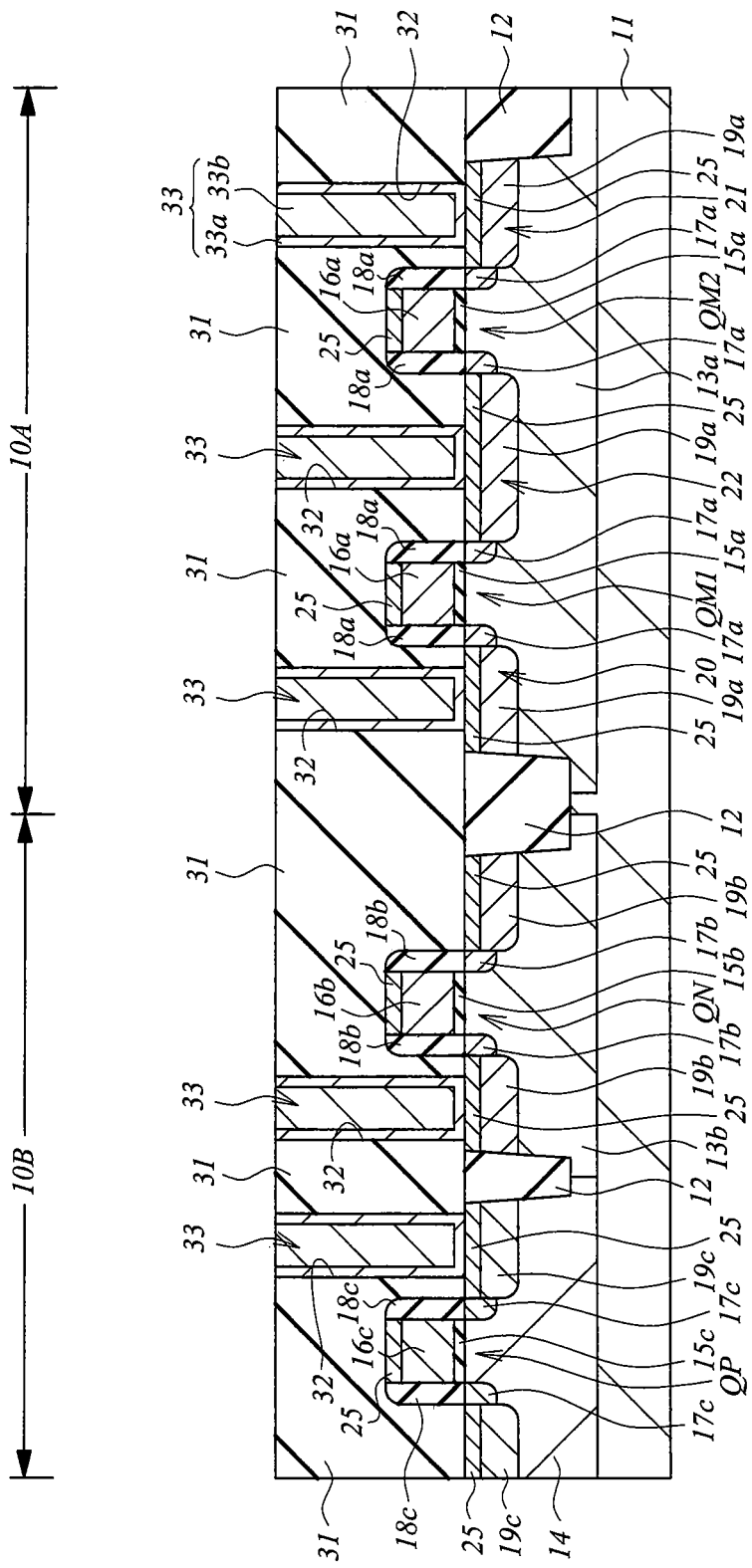
FIG. 21 is a cross-sectional view showing the principal part in the manufacturing process of the semiconductor device continued from FIG. 20.

Next, as shown in FIG. 21, the insulating film (interlayer insulating film) 31 is formed on the semiconductor substrate 11 so as to cover the gate electrodes 16a, 16b and 16c. The insulating film 31 is formed of, for example, a silicon oxide film. The insulating film 31 can be formed of a laminated film of a plurality of insulating films. After the formation of the insulating film 31, the upper surface of the insulating film 31 is planarized as required by, for example, CMP. By this means, the upper surface of the insulating film 31 has approximately the same height in the phase change memory region 10A and the peripheral circuit region 10B.

Next, with using a photoresist pattern (not shown) formed on the insulating film 31 by photolithography as an etching mask, dry etching is performed to the insulating film 31, thereby forming the contact holes 32 in the insulating film 31. At the bottom of the contact holes 32, a part of the main surface of the semiconductor substrate 11, for example, a part of (the metal silicide layer 25 on the surfaces of) the n$^+$-type semiconductor regions 19a and 19b and the p$^+$-type semiconductor region 19c and a part of (the metal silicide layer 25 on the surfaces of) the gate electrodes 16a, 16b and 16c are exposed.

Next, the plugs 33 are formed in the contact holes 32. At this time, for example, the conductive barrier film 33a is formed by sputtering or the like on the insulating film 31 including the inside of the contact holes 32, and then the tungsten film 33b is formed by CVD or the like on the conductive barrier film 33a so as to fill the contact holes 32. Then, unnecessary portions of the tungsten film 33b and the conductive barrier film 33a on the insulating film 31 are removed by CMP, an etch-back technique, and the like. In this manner, the plugs 33 formed of the tungsten film 33b and the conductive barrier film 33a left and embedded in the contact holes 32 can be formed.

Figure 22:
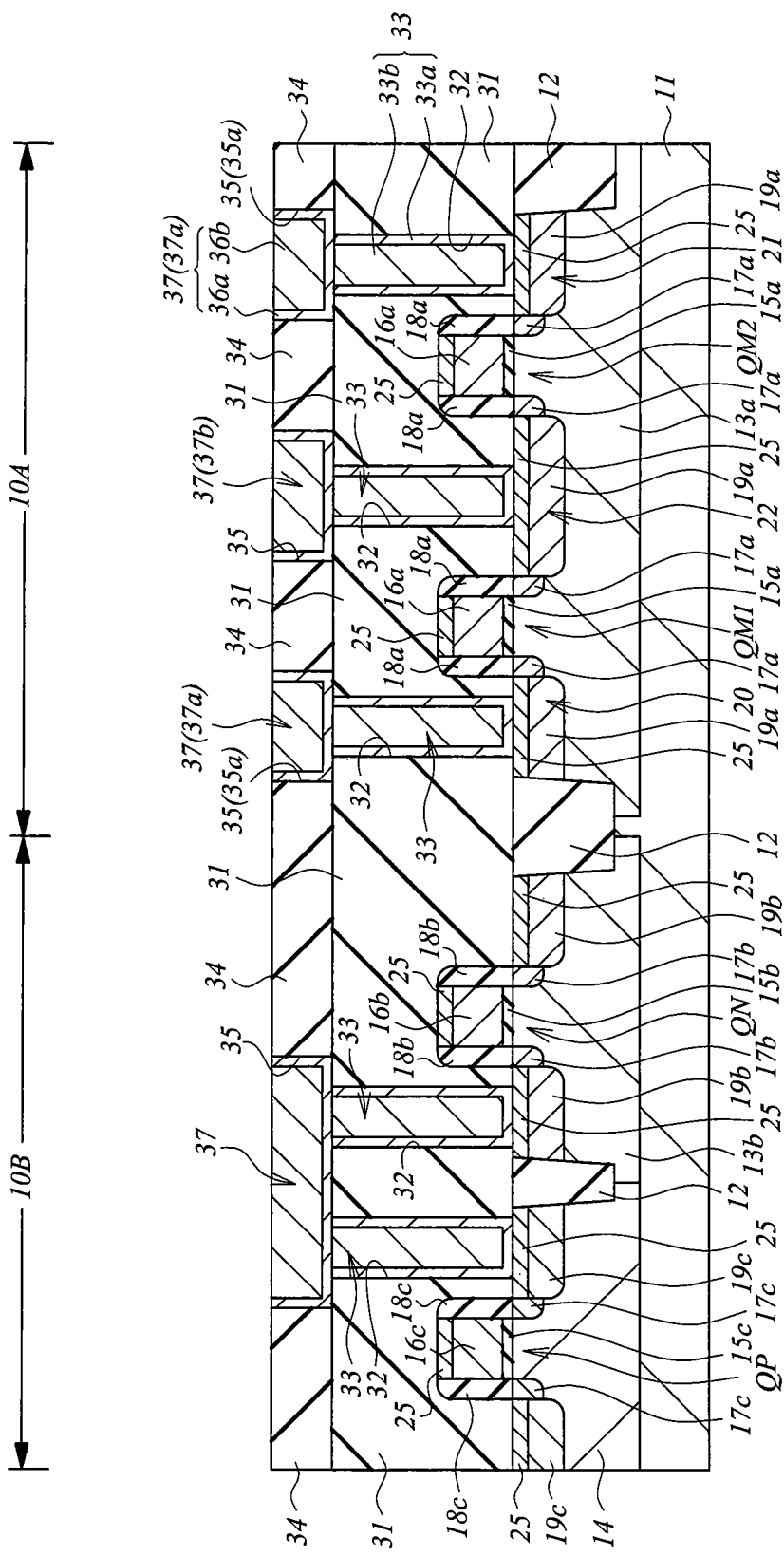
FIG. 22 is a cross-sectional view showing the principal part in the manufacturing process of the semiconductor device continued from FIG. 21.
Figure 23:
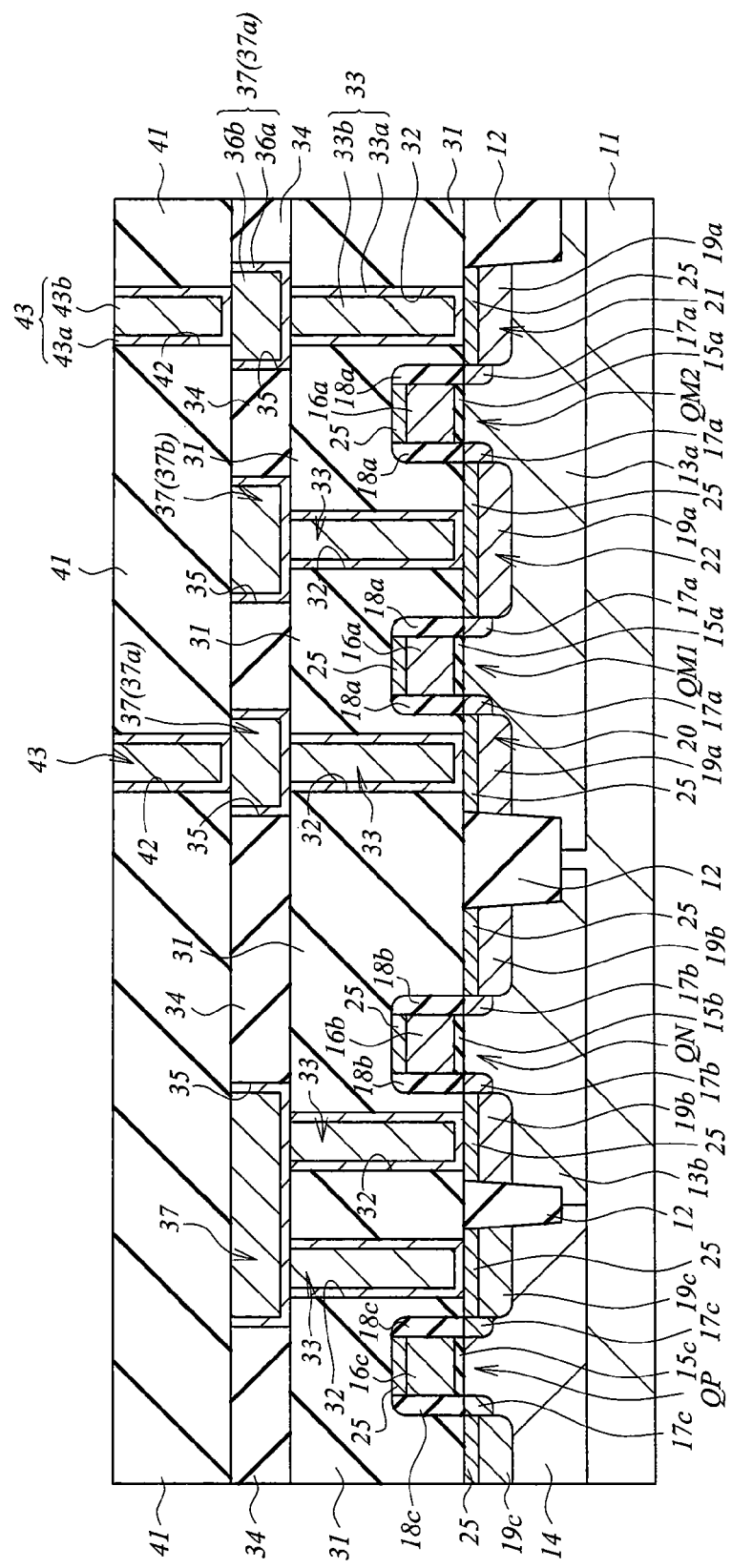
FIG. 23 is a cross-sectional view showing the principal part in the manufacturing process of the semiconductor device continued from FIG. 22.

Next, as shown in FIG. 22, the insulating film 34 is formed on the insulating film 31 in which the plugs 33 are embedded. Then, with using a photoresist pattern (not shown) formed by using photolithography on the insulating film 34 as an etching mask, dry etching is performed to the insulating film 34, thereby forming wiring trenches (openings) 35 in the insulating film 34. At the bottom of the wiring trenches 35, the upper surfaces of the plugs 33 are exposed. Note that, of the wiring trenches 35, the wiring trenches 35 or the openings 35a which expose the plugs 33 formed on the drain regions (semiconductor regions 20 and 21) of the MISFETs QM1 and QM2 in the phase change memory region 10A can be formed as hole-shaped (connection-hole-shaped) patterns having planar dimensions larger than those of the plugs 33 exposed therefrom instead of trench-shaped patterns. Also, in the present embodiment, the openings 35a are formed simultaneously with the other wiring trenches 35. Alternatively, the openings 35a and the other wiring trenches 35 can be formed in the different processes by separately using a photoresist pattern for forming the openings 35a and a photoresist pattern for forming the other wiring trenches 35.

Next, the wirings 37 are formed in the wiring trenches 35. At this time, for example, after the conductive barrier film 36a is formed on the insulating film 34 including the inside (bottom and sidewalls) of the wiring trenches 35 by sputtering or the like, the main conductive film 36b formed of a tungsten film or the like is formed by CVD or the like on the conductive barrier film 36a so as to fill the wiring trenches 35, and then, unnecessary portions of the main conducive film 36b and the conductive barrier film 36a on the insulating film 34 are removed by CMP, an etch-back technique, and the like. In this manner, the wirings 37 formed of the main conductive film 36b and the conductive barrier film 36a left and embedded in the wiring trenches 35 can be formed.

Of the wirings 37, the wirings 37a formed in the openings 35a in the phase change memory region 10A are electrically connected via the plugs 33 to the drain regions (semiconductor regions 20 and 21) of the MISFETs QM1 and QM2 in the phase change memory region 10A. The wiring 37a does not extend over the insulating film 31 so as to connect the semiconductor elements formed on the semiconductor substrate 11, but locally exists on the insulating film 31 so as to electrically connect the plug 43 and the plug 33 and is interposed between the plug 43 and the plug 33. Therefore, the wiring 37a can be regarded as a conductive portion for connection (contact electrode) instead of a wiring. Also, in the phase change memory region 10A, the source wiring 37b connected via the plug 33 to the semiconductor region 22 for source of the MISFETs QM1 and QM2 (n$^+$-type semiconductor region 19a) is formed of the wiring 37.

The wiring 37 is not limited to the embedded tungsten wiring as described above, but can be variously modified. For example, the wiring 37 can be a non-embedded tungsten wiring or an aluminum wiring.

Next, as shown in FIG. 23, the insulating film (interlayer insulating film) 41 is formed on the insulating film 34 in which the wirings 37 are embedded.

Next, with using a photoresist pattern (not shown) formed by using photolithography on the insulating film 41 as an etching mask, dry etching is performed to the insulating film 41, thereby forming the through holes (openings or connection holes) 42 in the insulating film 41. The through holes 42 are formed in the phase change memory region 10A, and the upper surface of the wiring 37a is exposed at the bottom of each of the through holes 42.

Next, the plugs 43 are formed in the through holes 42. At this time, for example, the conductive barrier film 43a is formed by sputtering or the like on the insulating film 41 including the inside of the through holes 42, and then the tungsten film 43b is formed on the conductive barrier film 43a by CVD or the like so as to fill the through holes 42, and unnecessary portions of the tungsten film 43b and the conductive barrier film 43a on the insulating film 41 are removed by CMP, an etch-back technique, and the like. By this means, the plugs 43 formed of the tungsten film 43b and the conductive barrier film 43a left and embedded in the contact holes 42 can be formed. In this manner, the plugs 43 are formed by filling the openings (through holes 42) formed in the insulating film 41 with a conductive material.

Figure 24:
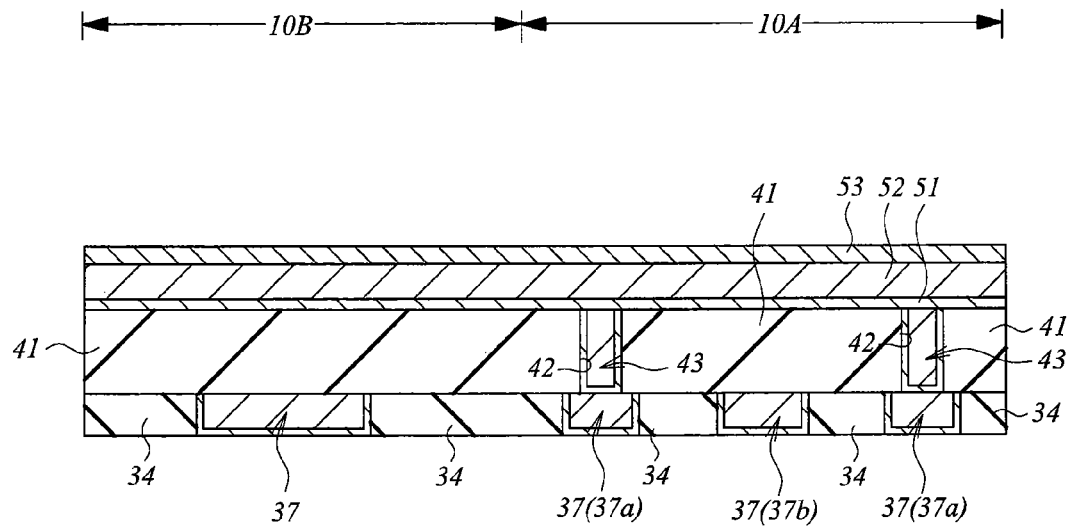
FIG. 24 is a cross-sectional view showing the principal part in the manufacturing process of the semiconductor device continued from FIG. 23.

Next, as shown in FIG. 24, the insulating film 51, the recording layer 52 and the upper electrode film 53 are sequentially formed (deposited) on the insulating film 41 in which the plugs 43 are embedded. Note that, as described above, the illustration of the insulating film 31 and portions corresponding to the structure therebelow in FIG. 23 is omitted in FIGS. 24 to 29. The insulating film 51 has a film thickness (deposition film thickness) of, for example, about 0.5 to 5 nm, the recording layer 52 has a film thickness (deposition film thickness) of, for example, about 10 to 200 nm, and the upper electrode film 53 has a film thickness (deposition film thickness) of, for example, about 10 to 200 nm.

Figure 25:
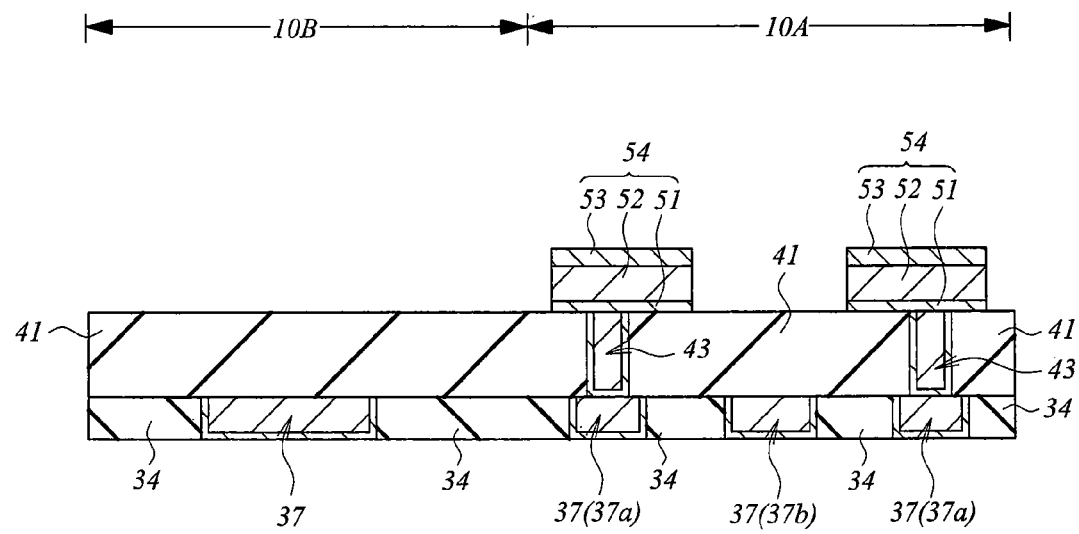
FIG. 25 is a cross-sectional view showing the principal part in the manufacturing process of the semiconductor device continued from FIG. 24.

Next, as shown in FIG. 25, by using photolithography and dry etching, a laminated film formed of the insulating film 51, the recording layer 52 and the upper electrode film 53 is patterned. By this means, the resistor element 54 formed of the laminated pattern of the upper electrode film 53, the recording layer 52 and the insulating film 51 is formed on the insulating film 41 in which the plugs 43 are embedded. The insulating film 51 can be used as an etching stopper film when the dry etching is performed to the upper electrode film 53 and the recording layer 52.

Figure 26:
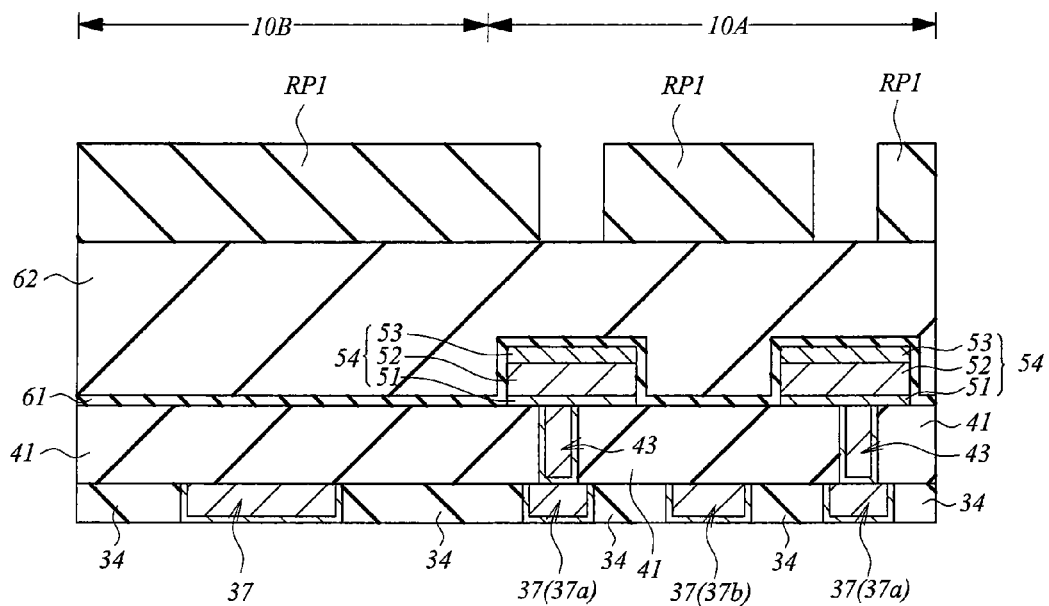
FIG. 26 is a cross-sectional view showing the principal part in the manufacturing process of the semiconductor device continued from FIG. 25.

Next, as shown in FIG. 26, the insulating film (etching stopper film) 61 is formed on the insulating film 41 so as to cover the resistor element 54. The insulating film 61 has a film thickness (deposition film thickness) of, for example, about 5 to 20 nm.

A material film that can be formed at the temperature at which the recording layer 52 does not sublimate (for example 400° C. or lower) is preferably used as the insulating film 61. When a silicon nitride film is used as the insulating film 61, the silicon nitride film can be preferably formed at the temperature at which the recording layer 52 does not sublimate (for example 400° C. or lower) by using the plasma CVD or the like, whereby the sublimation of the recording layer 52 at the time of the formation of the insulating film 61 can be prevented.

Next, the insulating film (interlayer insulating film) 62 is formed on the insulating film 61. The insulating film 62 is thicker than the insulating film 61 and can function as an interlayer insulating film. After the formation of the insulating film 62, as required, the upper surface of the insulating film 62 can be planarized by performing CMP or the like.

Then, by using photolithography, a photoresist pattern RP1 is formed on the insulating film 62. The photoresist pattern PR1 has openings at the positions where the through holes 63 are to be formed.

Figure 27:
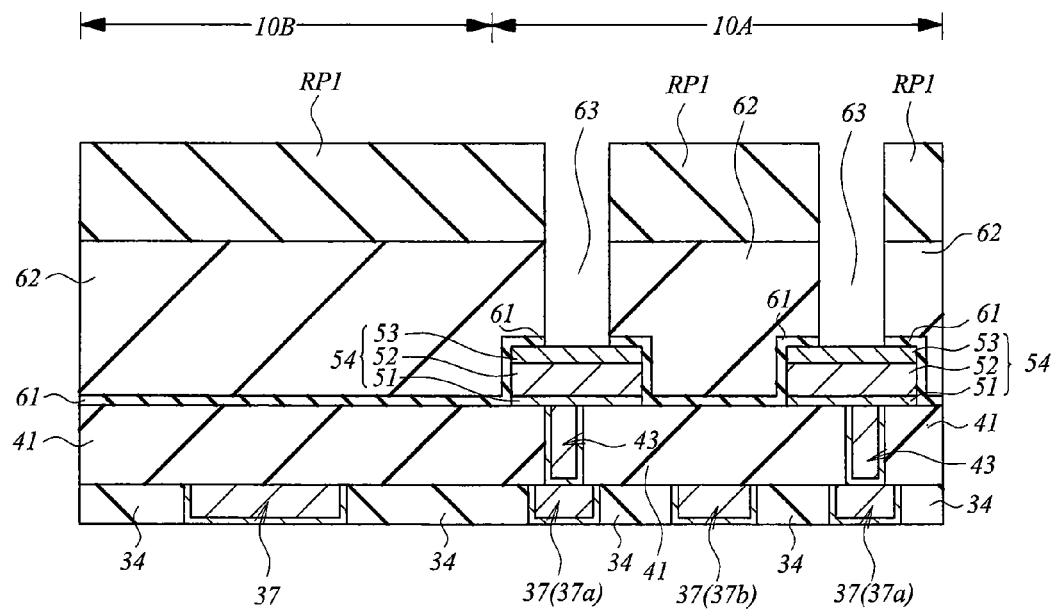
FIG. 27 is a cross-sectional view showing the principal part in the manufacturing process of the semiconductor device continued from FIG. 26.

Next, as shown in FIG. 27, the dry etching is performed to the insulating film 62 with using the photoresist pattern PR1 as an etching mask, thereby forming the through holes (openings, connection holes or via holes) 63 in the insulating films 61 and 62. At this time, the dry etching is first performed to the insulating film 62 under the conditions where the insulating film 62 is more prone to be etched than the insulating film 61 until the insulating film 61 is exposed, so as to make the insulating film 61 function as an etching stopper film, and then, the dry etching is performed to the insulating film 61 at the bottom of the through hole 63 under the conditions where the insulating film 61 is more prone to be etched than the insulating film 62, whereby the through holes 63 can be formed in the insulating films 61 and 62. Thereafter, the photoresist pattern RP1 is removed. At the bottom of the through holes 63, at least a part of the upper electrode film 53 of the resistor element 54 is exposed. Since the insulating film 61 as an etching stopper film is used, the overetching of the upper electrode film 53 can be prevented, and the etching damage at the time of the dry etching for forming the through holes 63 and the thermal load damage at the time of the formation of the conductive film for the plug 64 described later can be reduced. Accordingly, the change in the characteristics of the recording layer 52 in the region just below the plug 64 can be suppressed or prevented, and the reliability of the electric characteristics of the phase change memory can be improved. Further, since the sidewalls of the recording layer 52 are covered with the insulating film 61, even when the through holes are misaligned, it is possible to prevent the recording layer 52 from being exposed from the through hole 63, and it is possible to prevent the recording layer 52 from sublimating at the time of the formation of the conductive film for the plug 64 described later. Further, since the insulating film 61 can prevent the recording layer 52 from sublimating, the formation of foreign matters in the vicinity of the lower portion of the through holes 63 at the time of the formation of the through holes 63 can be prevented, and the foreign matters can be easily removed by cleaning even though they are formed.

Figure 28:
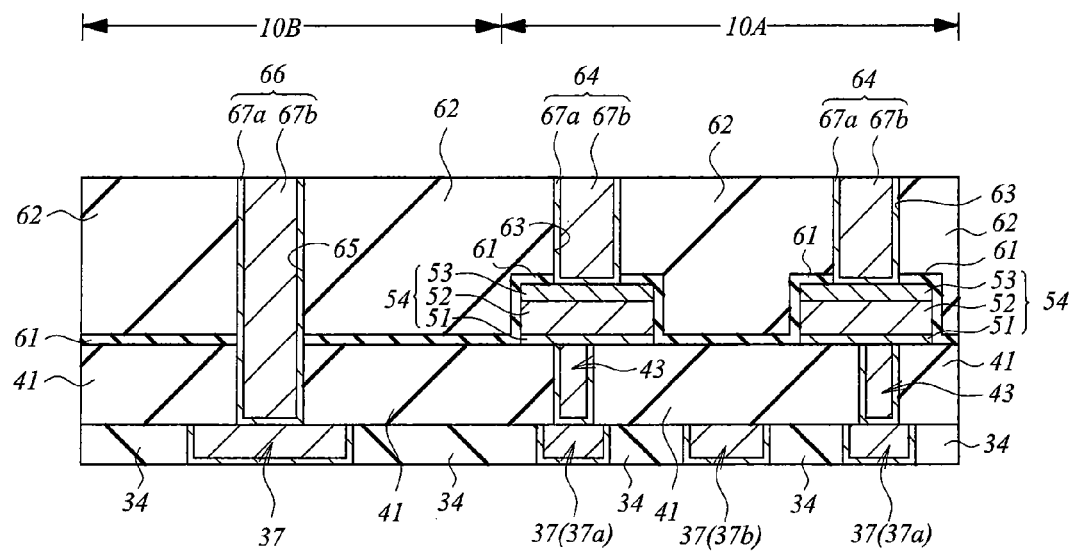
FIG. 28 is a cross-sectional view showing the principal part in the manufacturing process of the semiconductor device continued from FIG. 27.

Next, as shown in FIG. 28, with using another photoresist pattern (not shown) formed on the insulating film 62 by using photolithography as an etching mask, dry etching is performed to the insulating films 62, 61 and 41, thereby forming the through hole (opening or connection hole) 65 in the insulating films 62, 61 and 41. The through hole 65 is formed in the peripheral circuit region 10B, and the upper surface of the wiring 37 is exposed at the bottom of the through hole 65. Then, the photoresist pattern is removed. Note that the through holes 63 described above can be formed after the through hole 65 is first formed. Also, although the through hole 63 and the through holes 65 are preferably formed by different processes, they can be formed by the same process.

Next, the plugs 64 and 66 are formed in the through holes 63 and 65. At this time, for example, the conductive barrier film 67a is formed by sputtering or the like on the insulating film 62 including the inside of the through holes 63 and 65, and then the tungsten film 67b is formed by CVD or the like on the conductive barrier film 67a so as to fill the through holes 63 and 65. Then, unnecessary portions of the tungsten film 67b and the conductive barrier film 67a on the insulating film 62 are removed by CMP, an etch-back technique, and the like. In this manner, the plugs 64 formed of the tungsten film 67b and the conductive barrier film 67a left and embedded in the through holes 63 and the plug 66 formed of the tungsten film 67b and the conductive barrier film 67a left and embedded in the through hole 65 can be formed. An aluminum (Al) film, an aluminum alloy film (main conductive film) or the like can be used instead of the tungsten film 67b.

Further, the number of manufacturing processes can be reduced by forming the plugs 64 and 66 in the same process after forming the through holes 63 and 65. As another embodiment, after forming one of the through hole 63 and the through hole 65, the plug for filling the through hole (one of the plug 64 and the plug 66) is formed, and then, after forming the other of the through hole 63 and the through hole 65, the plug for filling the through hole (the other of the plug 64 and the plug 66) is formed.

Figure 29:
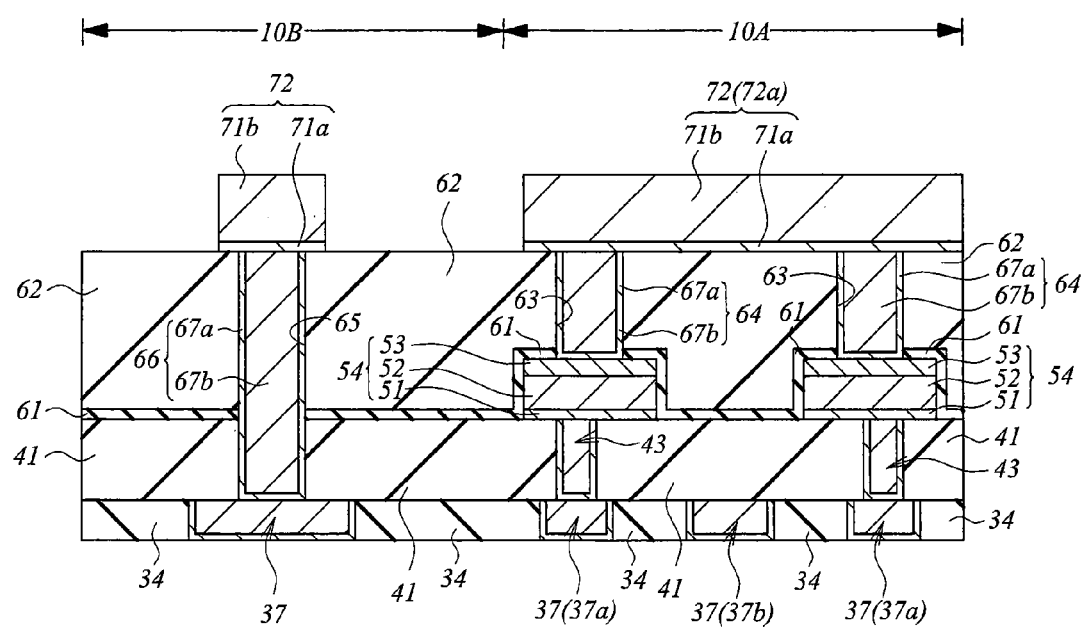
FIG. 29 is a cross-sectional view showing the principal part in the manufacturing process of the semiconductor device continued from FIG. 28.

Next, as shown in FIG. 29, the wiring 72 is formed as a second layer wiring on the insulating film 62 in which the plugs 64 and 66 are embedded. For example, on the insulating film 62 in which the plugs 64 and 66 are embedded, the conductive barrier film 71a and the aluminum film or aluminum alloy film 71b are sequentially formed by sputtering or the like and are then patterned by photolithography, dry etching, or the like, thereby forming the wiring 72. The wiring 72 is not limited to the aluminum wiring as described above, but can be variously modified. For example, a tungsten wiring or a copper wiring (embedded copper wiring) can be used.

Thereafter, an insulating film (not shown) as an interlayer insulating film is formed on the insulating film 62 so as to cover the wiring 72, and upper wiring layers (third and subsequent layer wirings) and others are further formed. However, the illustration and description thereof are omitted here. Then, after hydrogen annealing at approximately 400° C. to 450° C. is performed, a semiconductor device (semiconductor memory device) is completed.

Second Embodiment

Figure 30:
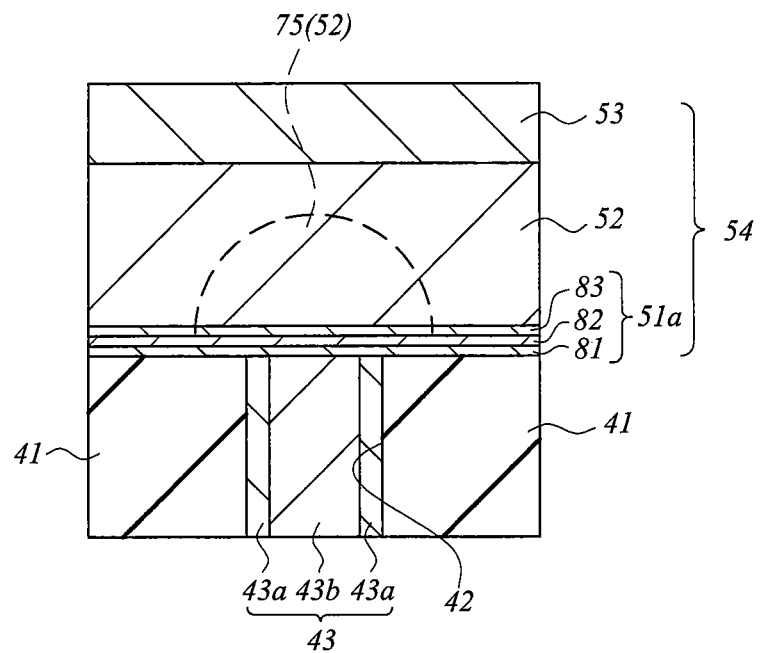
FIG. 30 is a cross-sectional view showing the principal part of the semiconductor device according to the second embodiment of the present invention.

FIG. 30 is a cross-sectional view of the semiconductor device according to the present embodiment, and it corresponds to FIG. 11 of the above-described first embodiment.

Since the semiconductor device according to the present embodiment is almost the same as the semiconductor device 1 of the above-described first embodiment other than that an insulating film 51a is used instead of the insulating film 51 of the first embodiment, the description of the configuration other than the insulating film 51a will be omitted here.

In the present embodiment, as shown in FIG. 30, the insulating film 51a is formed of a laminated film obtained by sequentially depositing a lower layer (first layer, first tantalum oxide layer) 81 made of tantalum oxide, an intermediate layer (second layer, tantalum layer) 82 made of metal tantalum and an upper layer (third layer, second tantalum oxide layer) 83 made of tantalum oxide on the insulating film 41 in which the plug 43 is embedded. Therefore, the insulating film 51a has the lower layer 81, the intermediate layer 82 on the lower layer 81 and the upper layer 83 on the intermediate layer 82.

As described above, in the present embodiment, the insulating film 51a is formed of a laminated film of a tantalum oxide layer and a tantalum layer, and is preferably formed of a laminated film of a first tantalum oxide layer (lower layer 81), a tantalum layer (intermediate layer 82) on the first tantalum oxide layer and a second tantalum oxide layer (upper layer 83) on the tantalum layer. Further, the recording layer 52 is formed on the upper layer 83 of the insulating film 51a. However, at the time of the formation of the insulating film 51a, the lower layer 81 and the upper layer 83 are made of tantalum oxide and the intermediate layer 82 is made of metal tantalum, but the metal tantalum constituting the intermediate layer 82 diffuses into the lower layer 81 and the upper layer 83 made of tantalum oxide through the various heat treatment processes after the formation of the insulating film 51a.

The intermediate layer 82 of the insulating film 51a diffuses into the lower layer 81 and the upper layer 83 by the annealing in the process step, and functions to reduce the work function of the tantalum oxide (lower layer 81 and upper layer 83). Therefore, the insulating film 51a formed of a laminated film of the lower layer 81, the intermediate layer 82 and the upper layer 83 can reduce the work function more than the case where it is formed of a single layer of tantalum oxide, and thus the difference in work function between the insulating film 51a and the recording layer 52 (corresponding to Δϕ described above) can be further increased. Accordingly, the band bending of the recording layer 52 (corresponding to ΔV described above) in the vicinity of the bonding interface between the insulating film 51a and the recording layer 52 is further increased, and the programming voltage can be further reduced.

The film thickness (deposition film thickness) of the lower layer 81 can be, for example, about 1 nm, the film thickness (deposition film thickness) of the intermediate layer 82 can be, for example, about 0.1 nm, and the film thickness (deposition film thickness) of the upper layer 83 can be, for example, about 1 nm. The film thickness of the intermediate layer 82 made of metal tantalum is preferably smaller than the film thickness of the lower layer 81 and the upper layer 83 made of tantalum oxide. This is because although the work function of the tantalum oxide (lower layer 81 and upper layer 83) is reduced by the diffusion of metal tantalum of the intermediate layer 82 into the lower layer 81 and the upper layer 83, the thermal conductivity of the tantalum oxide (lower layer 81 and upper layer 83) is reduced when the amount of diffusion is too large. In this manner, the heat insulation effect by the insulating film 51a can be ensured and the effect of reducing the programming current can be achieved.

Further, the case where the intermediate layer 82 made of metal tantalum is sandwiched between the lower layer 81 and the upper layer 83 having the same thickness has been described in the present embodiment. However, the lower layer 81 and the upper layer 83 made of tantalum oxide may have different thicknesses. Also, although the insulating film 51a is formed of a laminated film of the lower layer 81 made of tantalum oxide, the intermediate layer 82 made of metal tantalum and the upper layer 83 made of tantalum oxide in the present embodiment, either one of the lower layer 81 and the upper layer 83 may be omitted.

In the present embodiment, the programming voltage can be further reduced, and the operation by, for example, the voltage of 1.5 V required for the logic CMOS (CMISFET) operation can be realized (even in the phase change memory).

Third Embodiment

Figure 31:
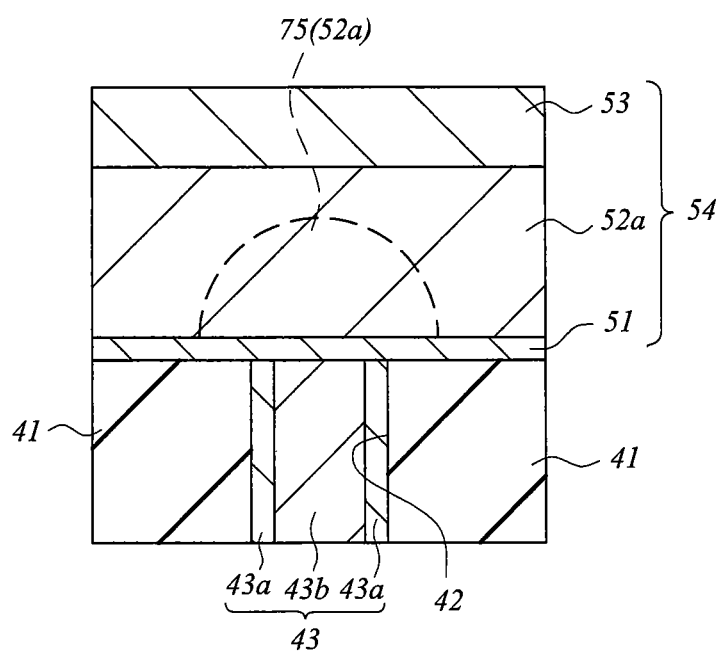
FIG. 31 is a cross-sectional view showing the principal part of the semiconductor device according to the third embodiment of the present invention.

FIG. 31 is a cross-sectional view showing the principal part of the semiconductor device according to the present embodiment, and it corresponds to FIG. 11 of the first embodiment described above.

Although the recording layer 52 of the phase change memory is made (formed) of Ge—Sb—Te based chalcogenide to which indium (In) is introduced (added) (that is, indium-added GST) in the first embodiment described above, the recording layer 52a (corresponding to the recording layer 52 of the first embodiment) of the phase change memory is made (formed) of Ge—Sb—Te based chalcogenide to which oxygen (O) is introduced (added) (hereinafter, referred to as oxygen-added GST) in the present embodiment. Therefore, in the present embodiment, the recording layer 52a contains germanium (Ge), antimony (Sb), tellurium (Te) and oxygen (O) as constituent elements thereof. The film thickness of the recording layer 52a can be, for example, about 100 nm.

Since the configuration of the semiconductor device according to the present embodiment is almost the same as the semiconductor device 1 of the above-described first embodiment other than that the recording layer 52a made of oxygen-added GST is used instead of the recording layer 52 made of indium-added GST, the description of the configuration other than the recording layer 52a will be omitted here.

As described above, the semiconductor device of the present embodiment has the plug 43 as a lower electrode formed on the semiconductor substrate 11, the insulating film 51 (first insulating film) formed on the plug 43 (lower electrode), the recording layer 52a made of oxygen-added GST (Ge—Sb—Te based chalcogenide to which oxygen is introduced) formed on the insulating film 51 and the upper electrode film 53 formed on the recording layer 52a. Similar to the recording layer 52 described above, the recording layer 52a is a phase change film made of a phase change material whose resistance value is changed through heat treatment, and is an information recording layer of a phase change memory.

Figure 32:
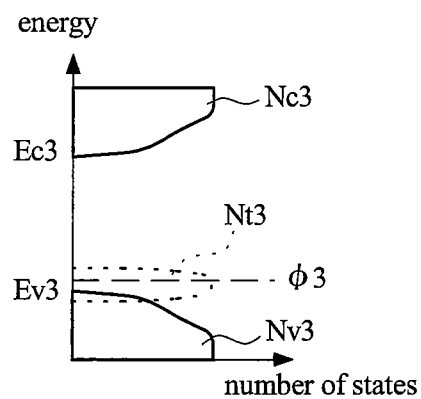
FIG. 32 is a band structure diagram of the oxygen-added GST.

FIG. 32 shows the band structure of oxygen-added GST used for the recording layer 52a of the present embodiment. FIG. 32 corresponds to FIG. 16 of the first embodiment described above. The horizontal axis of the band structure shown in FIG. 32 corresponds to the number of states (state density) and the vertical axis corresponds to the energy. The band structure diagram of oxygen-added GST in FIG. 32 shows the state density Nc3 of the conduction band, the state density Nv3 of the valence band, the work function $\phi 3$ (work function $\phi 3$ almost corresponds to Fermi level) and the state density Nt3 described later. Further, Ev3 corresponds to the energy at the end of the valence band (upper end of the valence band), and Ec3 corresponds to the energy at the end of the conduction band (lower end of the conduction band).

The oxygen-added GST is p-type semiconductor, and the work function $\phi 3$ thereof is located at a position slightly above the energy Ev3 at the end of the valence band. The band structure of the oxygen-added GST is characterized in that the state density Nt3 in the band gap of the oxygen-added GST caused by germanium oxide is present in the vicinity of the valence band (upper end of the valence band Ev3) as shown in FIG. 32. This state density Nt3 corresponds to the level caused by germanium oxide, and since germanium oxide is a foreign substance for GST, the level caused by the germanium oxide can be regarded as a defect level. By the introduction (addition) of oxygen (O) to GST, the state density Nt3 corresponding to (caused by) the level caused by germanium oxide is formed in the vicinity of the valence band (upper end of valence band Ev3), whereby the Fermi level moves toward the valence band (upper end of the valence band Ev3) side (that is, Fermi level is reduced), and the work function $\phi 3$ is increased. In other words, the work function $\phi 3$ of the oxygen-added GST is larger than the work function $\phi 0$ of the normal GST. Therefore, by forming the recording layer 52a from oxygen-added GST as described in the present embodiment, the effect of reducing the programming voltage can be achieved in comparison to the case where normal GST is used for the recording layer. This is because since the work function of the recording layer 52a ($\phi 3$) can be increased by forming the recording layer 52a from oxygen-added GST and thus the difference in work function (corresponding to $\Delta \phi$ described above) between the insulating film 51 and the recording layer 52a can be increased, the band bending of the recording layer 52a (corresponding to $\Delta V$ described above) in the vicinity of the bonding interface between the insulating film 51 and the recording layer 52a can be increased and the programming voltage can be reduced.

As described above, since the insulating film 51 is interposed between the plug 43 (lower electrode) and the recording layer 52a in the present embodiment, the effect of reducing the programming current of the phase change memory by the heat insulation by the insulating film 51 and the effect of preventing the peeling of the recording layer 52a by the insulating film 51 can be achieved. Furthermore, the problem of the increase of the programming voltage due to the reduction of the band bending of the chalcogenide recording layer caused by the contact with the insulating film (tantalum oxide layer) is dealt with by using oxygen-added GST for the recording layer 52a. By this means, it is possible to reduce the programming voltage of the phase change memory. Accordingly, in addition to the reduction of the programming current of the phase change memory and the prevention of the peeling of the chalcogenide recording layer, the reduction of the programming voltage of the phase change memory and the improvement of the performance and reliability of the semiconductor device having the phase change memory can be achieved.

According to the studies by the inventors of the present invention, the ratio (proportion) of oxygen (O) in the recording layer 52a made of oxygen-added GST, that is, the amount of oxygen (O) introduced (added) to the oxygen-added GST constituting the recording layer 52a is set within the range from 1 atom % to 10 atom %, thereby appropriately achieving the effect of reducing the programming voltage. When the ratio of oxygen in oxygen-added GST is larger than 10 atom %, the phase separation of Ge—Sb—Te occurs excessively, and therefore, the ratio of oxygen in oxygen-added GST is preferably 10 atom % or less.

In the present embodiment, the programming voltage can be reduced, and the operation by, for example, the voltage of 1.5 V required for the logic CMOS (CMISFET) operation can be realized (even in the phase change memory).

However, indium-added GST is superior to oxygen-added GST in heat resistance. Therefore, compared with the case where oxygen-added GST is used as the recording layer 52a of the phase change memory as described in the present embodiment, the reliability can be further improved in the case where indium-added GST is used as the recording layer 52 of the phase change memory as described in the first embodiment because the heat resistance of the phase change memory can be improved, the stability of the recording layer when rewriting is repeated many times can be improved and the deterioration of rewriting characteristics can be prevented.

Further, when oxygen (O) is introduced (added) to Ge—Sb—Te based chalcogenide as described in the present embodiment, the upper limit of the amount of introduced (added) oxygen is 10 atom %. On the other hand, when indium (In) is introduced (added) to Ge—Sb—Te based chalcogenide as described in the first embodiment, a larger amount can be introduced and indium (In) of up to about 30 atom % can be introduced (added). Therefore, the state density Nt2 in the band gap of the chalcogenide recording layer can be increased to increase the work function ($\phi 2$) of the recording layer 52 more appropriately and the programming voltage can be more reduced in the first embodiment than the present embodiment.

Fourth Embodiment

Figure 33:
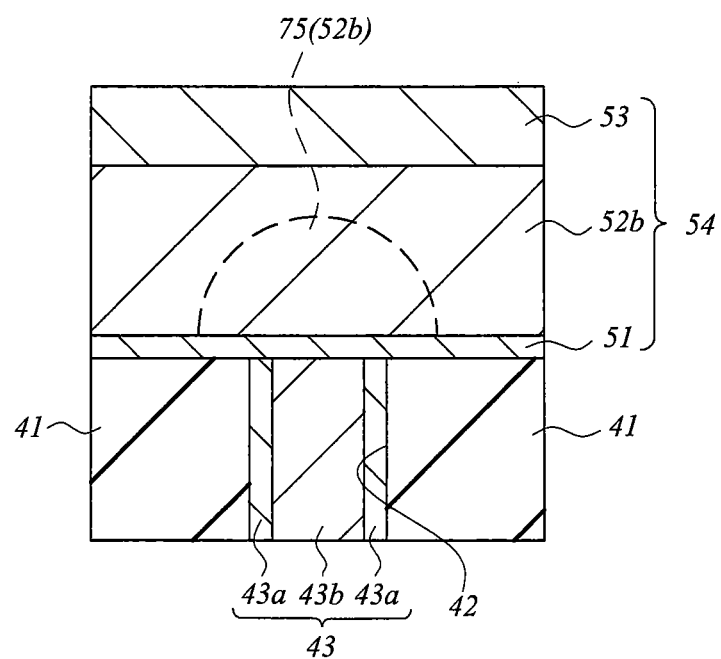
FIG. 33 is a cross-sectional view showing the principal part of the semiconductor device according to the fourth embodiment of the present invention.

FIG. 33 is a cross-sectional view showing the principal part of the semiconductor device according to the present embodiment, and it corresponds to FIG. 11 of the first embodiment described above.

Although the recording layer 52 of the phase change memory is made (formed) of Ge—Sb—Te based chalcogenide to which indium (In) is introduced (added) (that is, indium-added GST) in the first embodiment described above, the recording layer 52b of the phase change memory is made (formed) of Ge—Sb—Te based chalcogenide having high defect density (hereinafter, referred to as high-defect-density GST) as shown in FIG. 33 in the present embodiment. Therefore, in the present embodiment, the recording layer 52b contains germanium (Ge), antimony (Sb) and tellurium (Te) as constituent elements thereof. The film thickness of the recording layer 52b can be, for example, about 100 nm.

Since the configuration of the semiconductor device according to the present embodiment is almost the same as the semiconductor device 1 of the above-described first embodiment other than that the recording layer 52b made of high-defect-density GST is used instead of the recording layer 52 made of indium-added GST, the description of the configuration other than the recording layer 52b will be omitted here.

As described above, the semiconductor device of the present embodiment has the plug 43 as a lower electrode formed on the semiconductor substrate 11, the insulating film 51 (first insulating film) formed on the plug 43 (lower electrode), the recording layer 52b made of high-defect-density GST (Ge—Sb—Te based chalcogenide whose defect density is increased) formed on the insulating film 51 and the upper electrode film 53 formed on the recording layer 52b. Similar to the recording layers 52 and 52a described above, the recording layer 52b is a phase change film made of a phase change material whose resistance value is changed through heat treatment, and is an information recording layer of a phase change memory.

Figure 34:
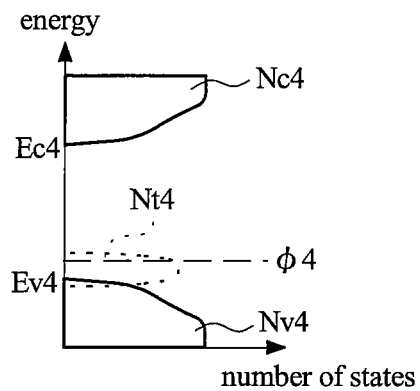
FIG. 34 is a band structure diagram of high-defect-density GST.

FIG. 34 shows the band structure of high-defect-density GST used for the recording layer 52b of the present embodiment. FIG. 34 corresponds to FIG. 16 of the first embodiment described above. The horizontal axis of the band structure shown in FIG. 34 corresponds to the number of states (state density) and the vertical axis corresponds to the energy. The band structure diagram of high-defect-density GST in FIG. 34 shows the state density Nc4 of the conduction band, the state density Nv4 of the valence band, the work function $\phi 4$ (work function $\phi 4$ almost corresponds to Fermi level) and the state density Nt4 described later. Further, Ev4 corresponds to the energy at the end of the valence band (upper end of the valence band), and Ec4 corresponds to the energy at the end of the conduction band (lower end of the conduction band).

The high-defect-density GST is p-type semiconductor, and the work function $\phi 4$ thereof is located at a position slightly above the energy Ev4 at the end of the valence band. The band structure of the high-defect-density GST is characterized in that the level caused by defect density (high defect density) is present in the vicinity of the valence band (upper end of the valence band Ev3). By the level caused by the defect density, the state density NT4 is present in the band gap of the high-defect-density GST as shown in FIG. 34. The defect density of GST (high-defect-density GST) is mainly due to the dangling bond of the disconnected tellurium bond. By the increase of the defect density of GST, the state density Nt4 corresponding to (caused by) the level caused by the defect density is formed in the vicinity of the valence band (upper end of valence band Ev3) in the high-defect-density GST, whereby the Fermi level moves toward the valence band (upper end of the valence band Ev4) side (that is, Fermi level is reduced), and the work function $\phi 4$ is increased. In other words, the work function $\phi 4$ of the high-defect-density GST is larger than the work function $\phi 0$ of the normal GST whose defect density is low. Therefore, by forming the recording layer 52b from high-defect-density GST as described in the present embodiment, the effect of reducing the programming voltage can be achieved in comparison to the case where normal GST is used for the recording layer. This is because since the work function of the recording layer 52b ($\phi 4$) can be increased by forming the recording layer 52b from high-defect-density GST and thus the difference in work function (corresponding to $\Delta \phi$ described above) between the insulating film 51 and the recording layer 52b can be increased, the band bending of the recording layer 52b (corresponding to $\Delta V$ described above) in the vicinity of the bonding interface between the insulating film 51 and the recording layer 52b can be increased and the programming voltage can be reduced.

As described above, since the insulating film 51 is interposed between the plug 43 (lower electrode) and the recording layer 52b in the present embodiment, the effect of reducing the programming current of the phase change memory by the heat insulation by the insulating film 51 and the effect of preventing the peeling of the recording layer 52b by the insulating film 51 can be achieved. Furthermore, the problem of the increase of the programming voltage due to the reduction of the band bending of the chalcogenide recording layer caused by the contact with the insulating film (tantalum oxide layer) is dealt with by using high-defect-density GST for the recording layer 52b. By this means, it is possible to reduce the programming voltage of the phase change memory. Accordingly, in addition to the reduction of the programming current of the phase change memory and the prevention of the peeling of the chalcogenide recording layer, the reduction of the programming voltage of the phase change memory and the improvement of the performance and reliability of the semiconductor device having the phase change memory can be achieved.

According to the studied by the inventors of the present invention, when the pressure of argon gas (pressure of argon gas in the chamber of sputtering apparatus (chamber in which the semiconductor substrate 11 is placed)) when the recording layer 52b is formed by sputtering (sputtering using argon) in the formation process of the recording layer 52b (process corresponding to the formation process of the recording layer 52 in FIG. 24 of the first embodiment described above) is set to, for example, 4 Pa or higher, Ar (argon) is taken in the GST film (recording layer 52b) to be formed and the defect density of the GST film (recording layer 52b) can be increased, whereby the recording layer 52b made of high-defect-density GST can be formed.

Therefore, by setting the pressure of argon gas in the formation process of the recording layer 52b to 4 Pa or higher, the defect density of the Ge—Sb—Te based chalcogenide film (that is, recording layer 52b) to be formed can be increased to increase the work function, whereby the effect of reducing the programming voltage can be achieved. Accordingly, the recording layer 52b is preferably formed of a Ge—Sb—Te based chalcogenide film formed by the sputtering in which the argon gas pressure is set to 4 Pa or higher.

In the present embodiment, the programming voltage can be reduced, and the operation by, for example, the voltage of 1.5 V required for the logic CMOS (CMISFET) operation can be realized (even in the phase change memory).

However, since the work function φ2 of indium-added GST can be controlled by adjusting the amount of indium in the indium-added GST in the first embodiment, the control of the work function of the recording layer 52 is easy. On the other hand, since the work function of the high-defect-density GST is controlled by adjusting the defect density of GST in the present embodiment, the control of the work function of the recording layer 52b is difficult in comparison to the first embodiment described above. Accordingly, compared with the present invention in which high-defect-density GST is used for the recording layer 52b, the stability of the phase change memory can be improved and the variation in the characteristics (drive voltage and others) of the phase change memory can be reduced in the above-described first embodiment in which indium-added GST is used for the recording layer 52.

Further, when the defect density of Ge—Sb—Te based chalcogenide is increased as described in the present embodiment, the defect density that can be formed is limited, and therefore, the state density Nt4 in the band gap of the chalcogenide recording layer is low in comparison to (the state density Nt2 of) the first embodiment using the indium-added GST and (the state density Nt3 of) the third embodiment using the oxygen-added GST. More specifically, Nt2>Nt3>Nt4>Nt0 is satisfied. Therefore, when comparing the recording layers 52, 52a, 52b and 252, the Fermi level of the recording layer 52 (indium-added GST) in the first embodiment is lowest (that is, closest to the end of valence band), the Fermi level of the recording layer 52a (oxygen-added GST) in the third embodiment is second lowest, the Fermi level of the recording layer 52b (high-defect-density GST) in the present embodiment is third lowest, and the Fermi level of the recording layer 252 (normal GST) in the second comparative example is highest. Namely, when comparing the recording layers 52, 52a, 52b and 252, the work function φ2 of the recording layer 52 (indium-added GST) in the first embodiment is highest, the work function φ3 of the recording layer 52a (oxygen-added GST) in the third embodiment is second highest, the work function φ4 of the recording layer 52b (high-defect-density GST) in the present embodiment is third highest, and the work function φ0 of the recording layer 252 (normal GST) in the second comparative example is lowest (φ2>+φ3>φ4>φ0). Accordingly, when comparing the phase change memories of the first, third and fourth embodiments and the second comparative example, the programming voltage is lowest in the first embodiment, second lowest in the third embodiment, third lowest in the fourth embodiment, and highest in the second comparative example.

Fifth Embodiment

Figure 35:
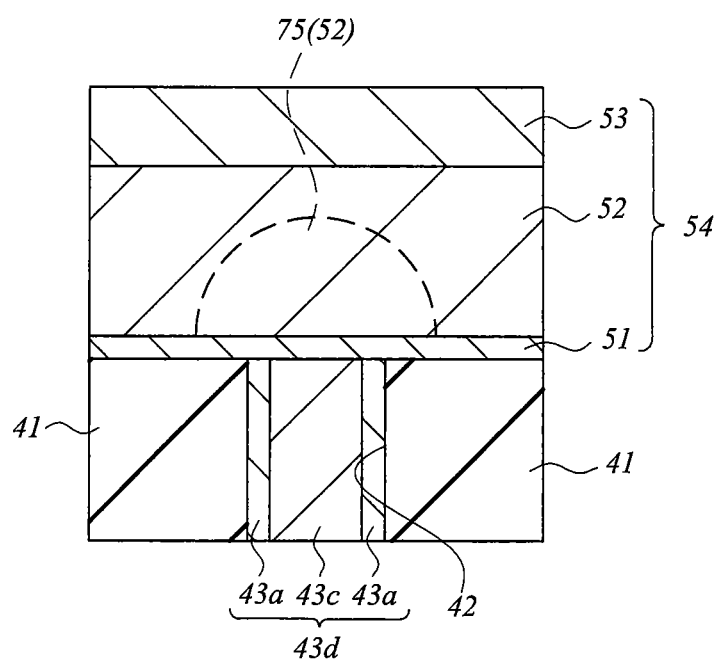
FIG. 35 is a cross-sectional view showing the principal part of the semiconductor device according to the fifth embodiment of the present invention.

FIG. 35 is a cross-sectional view showing the principal part of the semiconductor device according to the present embodiment, and it corresponds to FIG. 11 of the first embodiment described above.

Although the plug 43 is mainly formed (made) of the tungsten (W) film 43b in the first embodiment, a plug 43d is mainly formed (made) of a tantalum (Ta) film (tantalum metal film) 43c as shown in FIG. 35 in the present embodiment.

More specifically, in the phase change memory region 10A, the plug (contact electrode, lower electrode) 43d is formed instead of the plug 43 in the thorough hole 42 formed in the insulating film 41 as shown in FIG. 35. The plug 43d is formed of the conductive barrier film 43a formed on the bottom and sidewall of the through hole 42 and made of a titanium film, a titanium nitride film or a laminated film thereof and the tantalum (Ta) film (main conductive film) 43c formed on the conductive barrier film 43a so as to fill the through hole 42. Therefore, the plug 43d is a conductive portion formed (embedded) in the opening (through hole 42) of the insulating film 41, which is an interlayer insulating film, and is mainly formed of the tantalum oxide film 43c. Similar to the above-described plug 43, the plug 43d functions as a lower electrode of the phase change memory, and an upper portion thereof is in contact with and electrically connected to the lower portion of the resistor element 54 (lower surface of the insulating film 51). Further, similar to the above-described plug 43, a lower portion of the plug 43d is electrically connected to the semiconductor regions 20 and 21 (n+-type semiconductor regions 19a) for drain of the MISFETs QM1 and QM2 via the wiring 37a and the plug 33.

As described above, the lower electrode (plug 43) of the phase change memory is made of tungsten (tungsten plug) in the first embodiment, and the lower electrode (plug 43d) is made of tantalum (tantalum plug) in the present embodiment.

The plug 43d of the present embodiment can be formed in almost the same manner as that of the plug 43 in the first embodiment other than that the tantalum film 43c is formed instead of the tungsten film 43b. More specifically, after forming the through hole 42 in the insulating film 41, the conductive barrier film 43a is formed on the insulating film 41 including the inside of the through hole 42 by sputtering or the like, and then the tantalum film 43c is formed on the conductive barrier film 43a by CVD or the like so as to fill the through hole 42. Thereafter, unnecessary portions of the tantalum film 43c and the conductive barrier film 43a on the insulating film 41 are removed by CMP, an etch-back technique, and the like. In this manner, the plug 43d formed of the tantalum film 43c and the conductive barrier film 43a left and embedded in the contact hole 42 can be formed. As described above, the plug 43d is formed by filling the opening (through hole 42) formed in the insulating film 41 with a conductive material (mainly tantalum film 43c).

Since the configuration of the semiconductor device according to the present embodiment is almost the same as the semiconductor device 1 of the above-described first embodiment other than that the plug 43d using the tantalum film 43c as a main conductive film is used instead of the plug 43 using the tungsten film 43a as a main conductive film, the description of the configuration other than the plug 43d will be omitted here.

In the present embodiment, the plug 43d using the tantalum film 43c as a main conductive film serves as the lower electrode, and the resistor element 54 formed of the insulating film 51, the recording layer 52 and the upper electrode film 53 is formed on the plug 43d, thereby forming the phase change memory.

There is the possibility that the upper surface of the plug 43d is oxidized by the annealing (heat treatment, high-temperature process) in the manufacturing process of the semiconductor device (for example, by the temperature increase of the upper surface of the plug 43d in the formation process of the insulating film 51). However, in the present embodiment, the insulating film 51 is made of tantalum oxide, and the plug 43d is mainly formed of the tantalum film 43c. Therefore, in the present embodiment, even when the upper surface of the plug 43d is oxidized, an upper surface (upper layer portion) of the tantalum film 43c is oxidized and a tantalum oxide film is formed on the upper surface of the plug 43d. Accordingly, since the tantalum oxide film formed by the oxidation of the upper surface of the plug 43d is made of the same material as that of the insulating film 51 (tantalum oxide), even when the upper surface of the plug 43d is oxidized, it can be regarded as the increase in thickness of the insulating film 51 made of tantalum oxide, and an oxide film of different substance is not formed. Therefore, the variation of the electric characteristics of the phase change memory due to the oxidation of the plug (plug 43d in this case) constituting the lower electrode can be suppressed or prevented. As a result, the stability of the electric characteristics of the phase change memory can be further improved.

Furthermore, it is also possible to use a ruthenium (Ru) metal film or an iridium (Ir) metal film which is hardly oxidized by (the temperature of) the formation process of the insulating film 51 instead of the tantalum film 43c as the main conductive film of the plug 43d. By this means, the oxidation of the upper surface of the plug 43d by (the temperature of) the formation process of the insulating film 51 can be prevented, and the variation of the electric characteristics of the phase change memory can be suppressed or prevented. However, the case where tantalum (Ta) which is a constituent element of the insulating film 51 is used as the main conductive film to form the plug 43d as described above (that is, the tantalum film 43c is used) is more preferable because the influence on the electric characteristics of the phase change memory at the time when the upper surface of the plug 43d is oxidized can be reduced.

Further, not only in the case where indium-added GST is used for the recording layer (52) but also in the case where other phase change material (chalcogenide material) is used for the recording layer (52), if the insulating film 51 between the plug 43d and the recording layer (52) is a tantalum oxide film, when the plug 43d (plug 43d mainly made of tantalum) as described in the present embodiment is used as the lower electrode connected to the insulating film 51, the variation of the electric characteristics of the phase change memory by the oxidation of the lower electrode (plug 43d) can be suppressed or prevented, and the effect of improving the stability of the electric characteristics of the phase change memory can be achieved.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, the case where the chalcogenide crystal (recording layers 52, 52a and 52b) is p-type semiconductor has been described in the first to fifth embodiments. However, it is needless to say that, when the chalcogenide crystal is n-type semiconductor, it is effective for the reduction of the programming voltage to reduce the work function of chalcogenide (corresponding to recording layers 52, 52a and 52b) and increase the work function of the interface layer (corresponding to insulating films 51 and 51a).

Further, in the foregoing embodiments, the work functions of the recording layer 52 (indium-added GST), the recording layer 52a (oxygen-added GST), the recording layer 52b (high-defect-density GST), the recording layer 252 (GST) and the insulating films 51, 51a and 251 (tantalum oxide) have been described, and the work function mentioned here is the work function in the state where each layer (film) is separate and not in contact (bonded) with other layer (film) (flat band state). In other words, the work function mentioned here is the work function in the state where the recording layers 52, 52a, 52b and 252 are not bonded (not in contact) with and separate from the insulating films 51, 51a and 251 (flat band state). When the recording layers 52, 52a, 52b and 252 are bonded (in contact) with the insulating films 51, 51a and 251, the work functions deviate from those in the case where they are not bonded due to the pinning effect in some cases, but the change is not so large.

Further, the semiconductor device according to the present invention comprises: a lower electrode (corresponding to the plugs 43 and 43d) formed on a semiconductor substrate; a first insulating film (corresponding to the insulating films 51 and 51a) formed on the lower electrode; and a recording layer (corresponding to the recording layers 52, 52a and 52b) formed on the first insulating film and made of Ge—Sb—Te based chalcogenide, and it is characterized in that the Ge—Sb—Te based chalcogenide to which a process of increasing work function (that is, a process of reducing Fermi level) is performed is used as the recording layer. Since the Ge—Sb—Te based chalcogenide to which a process of increasing work function (that is, a process of reducing Fermi level) is performed is used as the recording layer, the difference in work function (corresponding to $\Delta\phi$ described above) between the first insulating film and the recording layer can be increased, and the band bending of the recording layer (corresponding to $\Delta V$ described above) in the vicinity of the bonding interface between the first insulating film and the recording layer can be increased. Therefore, the programming voltage can be reduced. The specific means of the process for increasing the work function (that is, reducing Fermi level) is to introduce (add) indium (In) to Ge—Sb—Te based chalcogenide in the above-described first embodiment, to introduce (add) oxygen (O) to Ge—Sb—Te based chalcogenide in the above-described third embodiment, and to increase the defect density of Ge—Sb—Te based chalcogenide in the above-described fourth embodiment.

INDUSTRIAL APPLICABILITY

The present invention can be preferably applied to, for example, a semiconductor device including a phase change memory.

The invention claimed is:

1. A semiconductor device, comprising:
a semiconductor substrate;
an interlayer insulating film formed over the semiconductor substrate;
a lower electrode formed in the interlayer insulating film;
a first insulating film formed directly on the lower electrode and the interlayer insulating film;
a recording layer formed on the first insulating film and made of Ge—Sb—Te based chalcogenide to which indium is introduced; and
an upper electrode formed on the recording layer,
wherein work function of the first insulating film is lower than work function of the chalcogenide,
wherein the first insulating film is formed between the lower electrode and the recording layer,
wherein the first insulating film has a laminated film of a first tantalum oxide layer and a tantalum layer,
wherein a thickness of the first insulating film is 0.5 to 5 nm and is smaller than a thickness of the recording layer, and
wherein a thickness of the tantalum layer is smaller than a thickness of the first tantalum oxide layer.

2. The semiconductor device according to claim 1, wherein the recording layer is made of a phase change material whose resistance value is changed by heat treatment.

3. The semiconductor device according to claim 2, wherein the recording layer is made of a phase change material containing Ge, Sb, Te and In as constituent elements thereof.

4. The semiconductor device according to claim 1, wherein the first insulating film is made of metal oxide.

5. The semiconductor device according to claim 1, wherein the first insulating film is made of tantalum oxide.

6. The semiconductor device according to claim 1, wherein the first insulating film is formed of a laminated film of a first tantalum oxide layer, a tantalum layer on the first tantalum oxide layer and a second tantalum oxide layer on the tantalum layer.

7. The semiconductor device according to claim 1, wherein a metal element constituting the lower electrode is diffused into the first insulating film.

8. The semiconductor device according to claim 1, wherein the lower electrode is made of tungsten.

9. The semiconductor device according to claim 1, wherein the lower electrode is made of tantalum.

10. The semiconductor device according to claim 1, wherein the lower electrode is embedded in an opening formed in the interlayer insulating film formed on the semiconductor substrate.

11. The semiconductor device according to claim 1, wherein the upper electrode film is formed of a tungsten film or a tungsten alloy film.

12. The semiconductor device according to claim 1, wherein the recording layer is an information recording layer of a phase change memory.

13. The semiconductor device according to claim 1, wherein an adhesion strength of the first insulating film to the interlayer insulating film is greater than an adhesion strength of the recording layer to the interlayer insulating film.

14. The semiconductor device according to claim 6,
wherein a thickness of the tantalum layer is smaller than a thickness of the first tantalum oxide layer, and
wherein a thickness of the tantalum layer is smaller than a thickness of the second tantalum oxide layer.

* * * * *